United States Patent
Sharma et al.

(10) Patent No.: US 11,764,807 B2
(45) Date of Patent: Sep. 19, 2023

(54) PROCESSING SYSTEM, RELATED INTEGRATED CIRCUIT, DEVICE AND METHOD

(71) Applicants: STMICROELECTRONICS APPLICATION GMBH, Aschheim-Dornach (DE); STMicroelectronics International N.V., Geneva (CH)

(72) Inventors: Vivek Mohan Sharma, New Delhi (IN); Roberto Colombo, Munich (DE)

(73) Assignees: STMICROELECTRONICS APPLICATION GMBH, Aschheim-Dornach (DE); STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/858,782

(22) Filed: Jul. 6, 2022

(65) Prior Publication Data
US 2023/0027826 A1    Jan. 26, 2023

(30) Foreign Application Priority Data

Jul. 13, 2021   (IT) .................. 102021000018440

(51) Int. Cl.
*H03M 13/11*   (2006.01)
*H03M 13/00*   (2006.01)

(52) U.S. Cl.
CPC ...... *H03M 13/1105* (2013.01); *H03M 13/611* (2013.01)

(58) Field of Classification Search
CPC ............. H03M 13/1105; H03M 13/611; G06F 11/1048; G06F 11/2215
See application file for complete search history.

(56) References Cited

U.S. PATENT DOCUMENTS

| 6,631,488 B1 | 10/2003 | Stambaugh et al. |
| 8,381,083 B2 | 2/2013 | Wezelenburg et al. |

(Continued)

FOREIGN PATENT DOCUMENTS

| EP | 1069503 A2 | 1/2001 |
| EP | 3534262 A1 | 9/2019 |

OTHER PUBLICATIONS

XILINX, Application Note: Cool Runner—II CPLD, "Single Error Correction and Double Error Detection (SECDED) with Cool Runner—IITM CPLDs," XAPP383 v1.2, Aug. 1, 2003, pp. 1-4.

*Primary Examiner* — Thien Nguyen
(74) *Attorney, Agent, or Firm* — SEED INTELLECTUAL PROPERTY LAW GROUP LLP

(57) ABSTRACT

A processing system is described. The processing system comprises a microprocessor, a memory controller, a resource and a communication system. The microprocessor is configured to send read requests in order to request the transmission of first data, or write requests comprising second data. The memory controller is configured to read third data from a memory. The processing system comprises also a safety monitor circuit comprising an error detection circuit configured to receive data bits and respective Error Correction Code, ECC, bits, wherein the data bits correspond to the first, second or third data. The safety monitor circuit calculates further ECC bits and generates an error signal by comparing the calculated ECC bits with the received ECC bits. A fault collection and error management circuit receives the error signal from the safety monitor circuits. For example the safety monitor circuit comprises a test circuit configured to provide modified data bits and/or modified ECC bits to the error detection circuit as a function of connectivity test control signals, whereby the error detection circuit asserts the error signal as a function of the connectivity test control signals. The processing system comprises (Continued)

also a connectivity test control circuit comprising control registers programmable via the microprocessor, wherein the connectivity test control signals are generated as a function of the content of the control registers.

20 Claims, 8 Drawing Sheets

(56) References Cited

U.S. PATENT DOCUMENTS

| | | |
|---|---|---|
| 2012/0131382 A1 | 5/2012 | Higeta |
| 2015/0212886 A1* | 7/2015 | Coteus .................. G06F 11/073 714/766 |
| 2016/0364280 A1 | 12/2016 | Perner |
| 2021/0357287 A1* | 11/2021 | Kim .................. H03M 13/1575 |

* cited by examiner

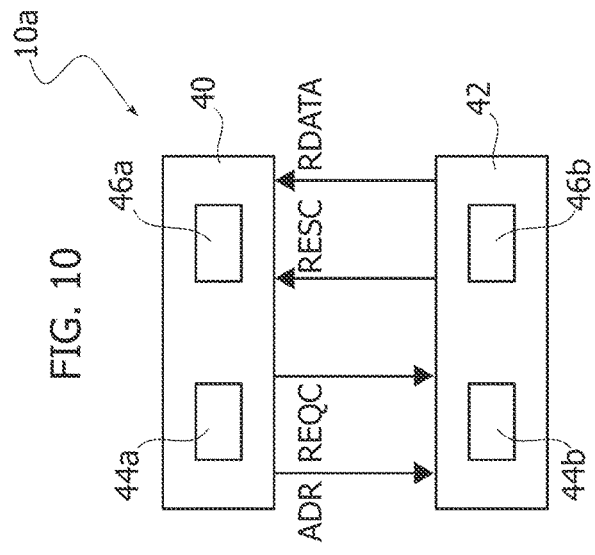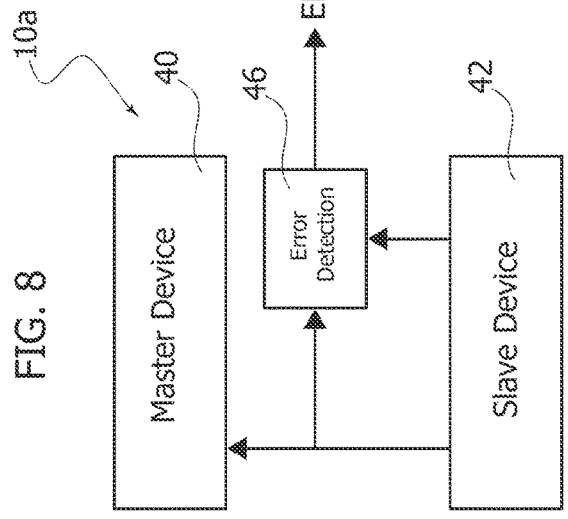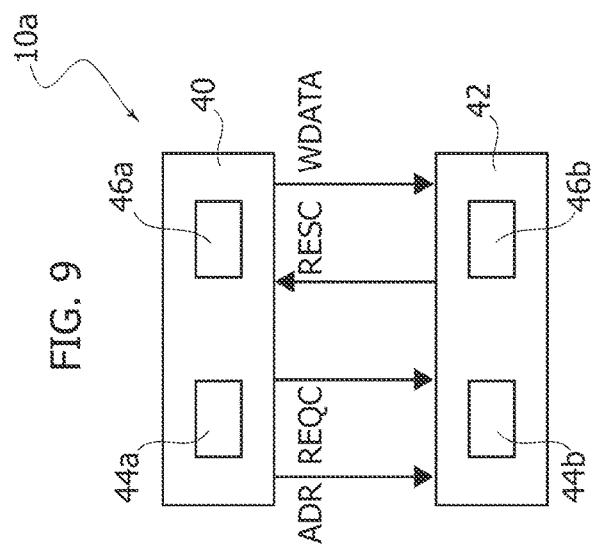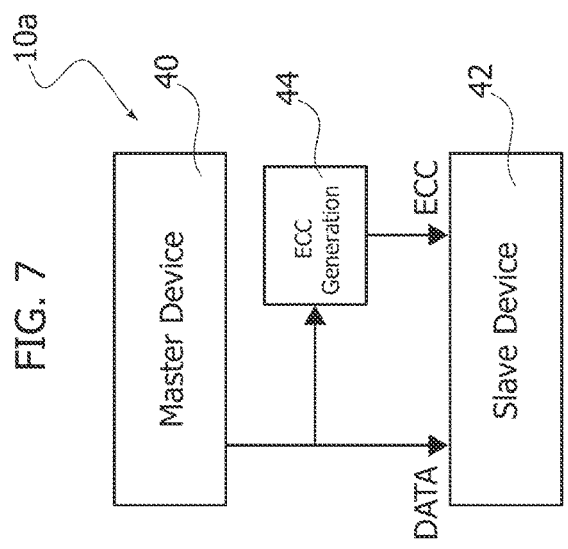

PROCESSING SYSTEM, RELATED INTEGRATED CIRCUIT, DEVICE AND METHOD

BACKGROUND

Technical Field

Embodiments of the present disclosure relate to the error management within processing systems, such as microcontrollers.

Description of the Related Art

A fault collection and error management circuit may be a complex system, including also the connections within the integrated circuit between the fault collection and error management circuit and the various safety monitor circuits. Moreover, the operation of the fault collection and error management circuit itself is safety relevant. For example, a non-reported error, for example because the error signal is stuck or the connection is broken, may create dangerous situation, e.g., in the context of automotive applications.

BRIEF SUMMARY

Various embodiments of the present disclosure provide solutions for monitoring the operation of a safety monitor circuit comprising a circuit configured to verify an error correction code (ECC).

As mentioned before, various embodiments of the present disclosure relate to a processing system. The processing system comprises a communication system and a processing core. For example, the processing core comprises a microprocessor and a master communication interface configured to transmit read or write requests from the microprocessor to the communication system. For example, a read request comprises a physical target address and requests the transmission of first data from the physical target address to the master communication interface of the processing core. Conversely, a write request comprises a physical target address and second data to be transmitted to the physical target address. Similar read or write requests may also be generated by other master interfaces, such as a DMA controller.

In various embodiments, the processing system also comprises a slave circuit, such as a memory controller and/or a resource configured to receive the read and/or write requests.

For example, in various embodiments, the memory controller is configured to, based on a memory address, read third data from a memory or write the third data to the memory. For this purpose, the memory controller may be configured to receive a request addressed to a first sub-range of the physical target addresses associated with the memory controller, determine the memory address as a function of the content of the received request, e.g., as a function of the physical address which may be mapped to a memory address, and determine whether the received request is a read or write request. In case the received request is a read request, the memory controller reads the third data from the memory address and transmits the read third data as the first data to the communication system. Conversely, when the received request is a write request, the memory controller extracts the second data from the write request and writes the extracted second data as third data to the memory address.

In various embodiments, the resource comprises one or more registers and a slave communication interface. This slave communication interface is connected to the communication system and configured to receive a request addressed to a second sub-range of the physical target addresses associated with the one or more registers, select one of the one or more registers as a function of the physical target address included in the received request and determine whether the received request is a read or write request. Accordingly, when the received request is a read request, the slave communication interface may transmit the content of the selected register as the first data to the communication system. Conversely, when the received request is a write request, the slave interface may extract the second data from the write request and write the extracted second data to the selected register.

For example, in various embodiments, the transactions exchanged via the communication system and/or the data stored to the memory managed by the memory controller may be protected with Error Correction Code, ECC, bits. Accordingly, in various embodiments, the processing system comprises one or more safety monitor circuits comprising an error detection circuit configured to receive data bits and respective ECC bits. For example, the data bits may correspond to the first data (i.e., data received in response to a read request), the second data (i.e., data received with a write request) or the third data (i.e., data read from the memory).

For example, in various embodiments, each error detection circuit is configured to calculate further ECC bits as a function of the respective data bits according to a given ECC scheme/code, and generate a syndrome by comparing the calculated ECC bits with the received ECC bits. Generally, in case of an error detection code, the syndrome may indicate a possible error. Conversely, in case of an error correction code, the syndrome may also be indicative of the position of possible incorrect bits. Accordingly, each error detection circuit may determine whether all bits of the respective syndrome are de-asserted, and assert an error signal when at least one of the bits of the syndrome is asserted.

In various embodiments, the various error signals generated by the safety monitor circuits are provided to a fault collection and error management circuit. For example, the fault collection and error management circuit may comprise one or more registers and store the logic levels of the error signals to the one or more registers. In this case, the fault collection and error management circuit may be configured to receive a read request addressed to a third sub-range of the physical target addresses associated with the one or more further registers, select one of the one or more registers as a function of the physical target address included in the received read request, and transmit the content of the selected further register as the first data to the communication system, thereby, e.g., provided the logic levels of the error signals to the microprocessor. Generally, the fault collection and error management circuit may also generate internal and/or external reaction signals, and/or implement a logging function.

For example, various embodiments of the present disclosure relate to the testing of the connectivity between such (ECC) safety monitor circuits and the fault collection and error management circuit.

In various embodiments, each safety monitor circuit comprises a test circuit configured to provide modified data bits and/or modified ECC bits to the respective error detection circuit as a function of one or more connectivity test control signals, whereby the error detection circuit asserts the error signal as a function of the connectivity test control signal.

In various embodiments, the processing system comprises also a connectivity test control circuit comprising one or more control registers programmable via the write requests, wherein the one or more connectivity test control signals are generated as a function of the content of the one or more control registers. Accordingly, the connectivity test control signals may be asserted by the microprocessor by sending respective write request to the connectivity test control circuit.

For example, in various embodiments, the connectivity test control circuit is configured to generate, e.g., via a combinational logic circuit, for each safety monitor circuit one or more respective connectivity test control signals as a function of respective one or more bits of the one or more control registers.

For example, in various embodiments, the setting of the one or more control registers does not trigger per se the connectivity test but just activates the modification of the data bits and/or ECC bits.

For example, concerning read requests, a first safety monitor circuit may be associated with the master communication interface of the processing core. For example, the master communication interface may be configured to receive, in response to a read request, in addition to the first data respective first ECC bits (which are generated accordingly by the circuit transmitting the response to the read request, such as the memory controller or resource). In this case, once having received the first data and the respective first ECC bits, the master communication interface may provide the first data and the respective first ECC bits to the first safety monitor circuit. Accordingly, only once the master communication interface receives the first data and provides the received data to the error detection circuit, the first error detection circuit processes the (modified) data bits and/or ECC bits, and the error signal of the first safety monitor circuit is selectively asserted as a function of the one or more connectivity test control signals.

Similarly, concerning write requests, a second safety monitor circuit may be associated with the memory controller or the resource (or similar slave devices connected to the communication system). For example, in this case, the memory controller or the resource may be configured to receive with a write request, in addition to the second data, respective second ECC bits (which are thus generated by the circuit transmitting the write request, e.g., the processing core). Accordingly, once having received a write request, the memory controller or the resource may provide the respective second data and the respective second ECC bits to the second safety monitor circuit, thereby selectively asserting the error signal of the second safety monitor circuit as a function of the one or more connectivity test control signals once the memory controller or the resource receives the write request.

In various embodiments, such slave devices connected to the communication system may also verify the address included in the read or write requests. For this purpose, a third safety monitor circuit may be associated, e.g., with the memory controller or the resource, wherein the memory controller or the resource is configured to receive with a read or write request, in addition to the address, respective third ECC bits (which are thus generated by the circuit sending the request) and, once having received a read or write request, provide the respective address and the respective third ECC bits to the third safety monitor circuit, thereby selectively asserting the error signal of the third safety monitor circuit as a function of the one or more connectivity test control signals once the memory controller or the resource receives the read or write request.

Finally, in case of read operation of the memory, a fourth safety monitor circuit may be associated with the memory controller, wherein the memory controller is configured to read in addition to the third data respective fourth ECC bits from the memory address. For example, the fourth ECC bits may be stored to the memory when writing data to the memory. Accordingly, once having received the third data and the respective fourth ECC bits, the memory controller may provide the third data and the respective fourth ECC bits to the fourth safety monitor circuit, thereby selectively asserting the error signal of the fourth safety monitor circuit as a function of the one or more connectivity test control signals once the memory controller reads data from the memory.

In various embodiments, one or more of the safety monitor circuits may also provide the respective syndrome and/or address signal to the fault collection and error management circuit. For example, the first safety monitor circuit may be configured to, in response to determining that at least one of the bits of the respective syndrome is asserted, transmit the respective syndrome and/or the address included in the respective read request to the fault collection and error management circuit. Similarly, the second safety monitor circuit may be configured to, in response to determining that at least one of the bits of the respective syndrome is asserted, transmit the respective syndrome and/or the address included in the respective write request to the fault collection and error management circuit. Finally, the fourth safety monitor circuit may be configured to, in response to determining that at least one of the bits of the respective syndrome is asserted, transmit the respective syndrome and/or the memory address used for the respective read operation to the fault collection and error management circuit.

For example, in various embodiments, these additional signals may be transmitted via an error bus to the fault collection and error management circuit, i.e., the first and/or second safety monitor circuits may be configured to transmit the syndrome and/or the address via the error bus, and/or the fourth safety monitor circuit may be configured to transmit the syndrome and/or the memory address via the error bus.

In various embodiments, the safety monitor circuit verifying data signals may also permit a syndrome connectivity test. For this purpose, the first, second and/or fourth safety monitor circuits may comprise a multiplexer configured to selectively provide to the respective error detection circuit, when the connectivity test control signals have a first value (corresponding to a normal operation state), the first data, the second data or the third data, respectively, and the respective first, second or third ECC bits. Conversely, when the connectivity test control signals have a second value, the multiplexer provides a first bit sequency, wherein the first bit sequency is configured to generate a first syndrome when processed by the respective error detection circuit. Moreover, when the connectivity test control signals have a third value, the multiplexer provides a second bit sequency, wherein the second bit sequency is configured to generate a second syndrome when processed by the respective error detection circuit, wherein the second syndrome corresponds to a bit sequency having inverted values with respect to the bit sequence of the first syndrome. Accordingly, the first and second bit-sequences may be used to set all bits of the data lines used to transmit the syndrome to the fault collection and error management circuit selectively to high or low.

In various embodiments, in order to perform a connectivity test of the data lines used to transmit the address signal to the fault collection and error management, it is sufficient to activate the connectivity test for two addresses having complementary bit sequences.

Accordingly, the full overwrite function via a multiplexer is not required for the error detection circuit(s) verifying address signals. For example, the third safety monitor circuit may comprise just a combinational logic circuit configured to selectively invert the logic level of one or more bits, such as one or two bits, of the address and/or the respective third ECC bits.

Generally, as will be described in greater detail in the following, the connectivity test may also be extended to error detection circuits configured to generate plural error signal, e.g., by generating different error types, such a single bit error and a double bit error in case of a Single-Error Correct Double-Error Detect Code, and/or error detection circuits configured to verify ECC bits associated with control signals.

BRIEF DESCRIPTION OF THE SEVERAL VIEWS OF THE DRAWINGS

Embodiments of the present disclosure will now be described with reference to the annexed drawings, which are provided purely by way of non-limiting example and in which:

FIG. 7 shows an embodiment of a processing system configured to generate ECC bits as a function of data bits;

FIG. 8 show an embodiment of a processing system configured to use ECC bits in order to detect and in some embodiments correct errors in data bits;

FIG. 9 shows an embodiment of a processing system configured to protect write requests with additional ECC bits;

FIG. 10 shows an embodiment of a processing system configured to protect read requests with additional ECC bits;

DETAILED DESCRIPTION

Figure 1:
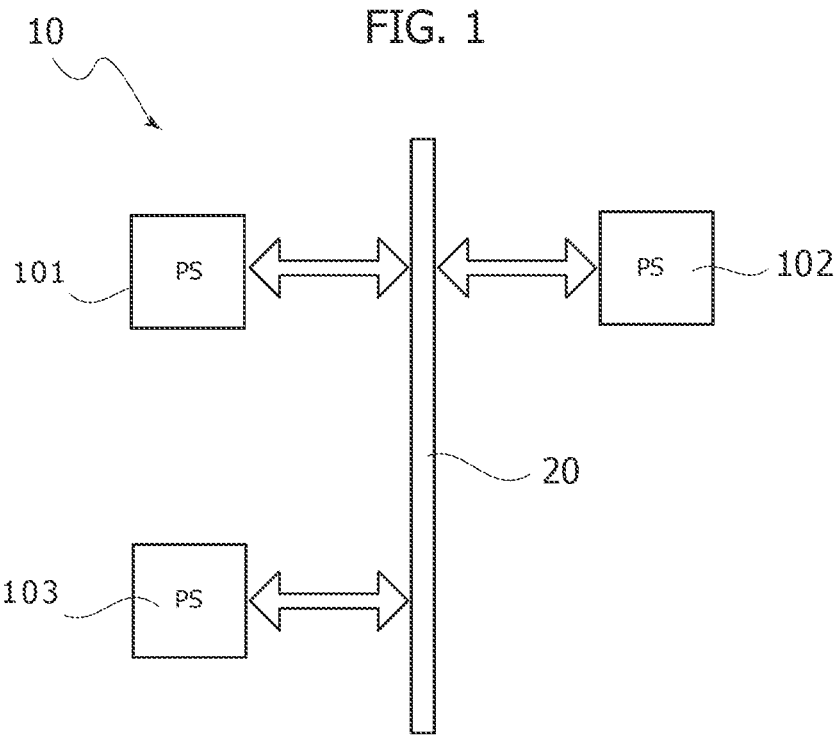
FIG. 1 shows an example of an electronic system comprising a plurality of processing systems.

FIG. 1 shows a typical electronic system, such as the electronic system of a vehicle, comprising a plurality of processing systems 10, such as embedded systems or integrated circuits, e.g., a Field Programmable Gate Array (FPGA), a Digital Signal Processor (DSP) or a micro-controller (e.g., dedicated to the automotive market).

For example, in FIG. 1 are shown three processing systems (PS) 101, 102 and 103 connected through a suitable communication system 20. For example, the communication system may include a vehicle control bus, such as a Controller Area Network (CAN) bus, and possibly a multimedia bus, such as a Media Oriented Systems Transport (MOST) bus, connected to vehicle control bus via a gateway. Typically, the processing systems 10 are located at different positions of the vehicle and may include, e.g., an Engine Control Unit, a Transmission Control Unit (TCU), an Anti-lock Braking System (ABS), a Body Control Module (BCM), and/or a navigation and/or multimedia audio system. Accordingly, one or more of the processing systems 10 may also implement real-time control and regulation functions. These processing systems are usually identified as Electronic Control Units.

Figure 2:
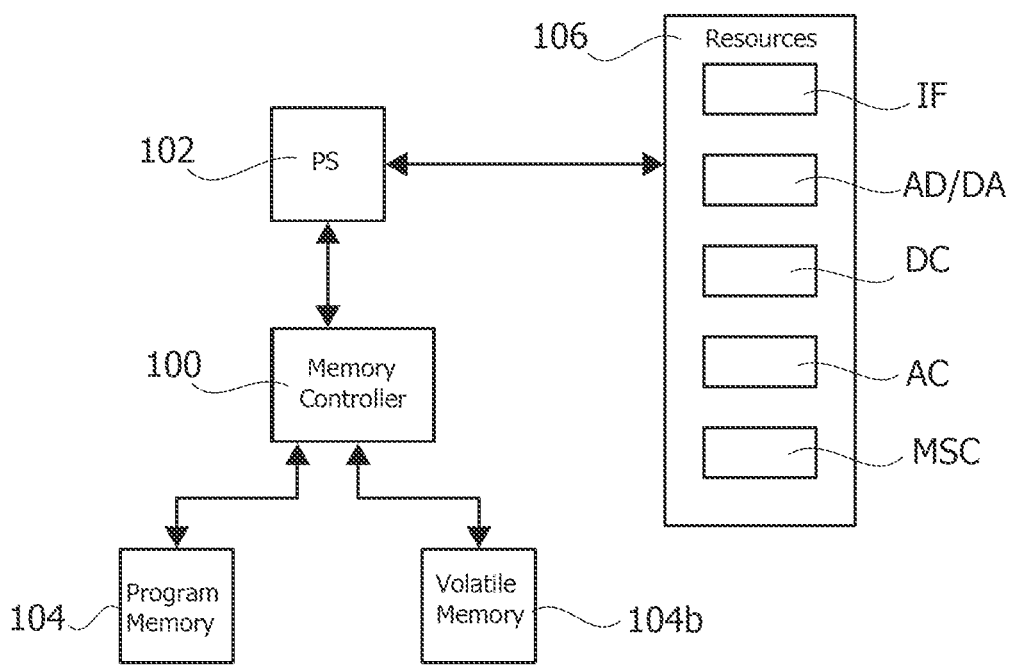
FIGS. 2 and 3 show examples of processing systems.

FIG. 2 shows a block diagram of an exemplary digital processing system 10, such as a micro-controller, which may be used as any of the processing systems 10 of FIG. 1.

In the example considered, the processing system 10 comprises a microprocessor 102, usually the Central Processing Unit (CPU), programmed via software instructions. Usually, the software executed by the microprocessor 102 is stored in a non-volatile program memory 104, such as a Flash memory or EEPROM. Thus, the memory 104 is configured to store the firmware of the processing unit 102, wherein the firmware includes the software instructions to be executed by the microprocessor 102. Generally, the non-volatile memory 104 may also be used to store other data, such as configuration data, e.g., calibration data.

The microprocessor 102 usually has associated also a volatile memory 104b, such as a Random-Access-Memory (RAM). For example, the memory 104b may be used to store temporary data.

As shown in FIG. 2, usually the communication with the memories 104 and/or 104b is performed via one or more memory controllers 100. The memory controller(s) 100 may be integrated in the microprocessor 102 or connected to the microprocessor 102 via a communication channel, such as a system bus of the processing system 10. Similarly, the memories 104 and/or 104b may be integrated with the microprocessor 102 in a single integrated circuit, or the memories 104 and/or 104b may be in the form of a separate integrated circuit and connected to the microprocessor 102, e.g., via the traces of a printed circuit board.

In the example considered, the microprocessor 102 may have associated one or more (hardware) resources/peripherals 106 selected from the group of:

- one or more communication interfaces IF, e.g., for exchanging data via the communication system 20, such as a Universal asynchronous receiver/transmitter (UART), Serial Peripheral Interface Bus (SPI), Inter-Integrated Circuit (I$^2$C), Controller Area Network (CAN) bus, and/or Ethernet interface, and/or a debug interface; and/or
- one or more analog-to-digital converters AD and/or digital-to-analog converters DA; and/or
- one or more dedicated digital components DC, such as hardware timers and/or counters, or a cryptographic co-processor; and/or
- one or more analog components AC, such as comparators, sensors, such as a temperature sensor, etc.; and/or
- one or more mixed signal components MSC, such as a PWM (Pulse-Width Modulation) driver.

Generally, a dedicated digital components DC may also correspond to a FPGA integrated in the processing system 10. For example, in this case, the memory 104 may also comprise the program data for such a FPGA.

Accordingly, the digital processing system 10 may support different functionalities. For example, the behavior of the microprocessor 102 is determined by the firmware stored in the memory 104, e.g., the software instructions to be executed by a microprocessor 102 of a micro-controller 10. Thus, by installing a different firmware, the same hardware (micro-controller) can be used for different applications.

In this respect, future generation of such processing systems 10, e.g., micro-controllers adapted to be used in automotive applications, are expected to exhibit an increase in complexity, mainly due to the increasing number of requested functionalities (new protocols, new features, etc.) and to the tight constraints of execution conditions (e.g., lower power consumption, increased calculation power and speed, etc.).

For example, recently more complex multi-core processing systems 10 have been proposed. For example, such multi-core processing systems may be used to execute (in parallel) several of the processing systems 10 shown in FIG. 1, such as several ECUs of a vehicle.

Figure 3:
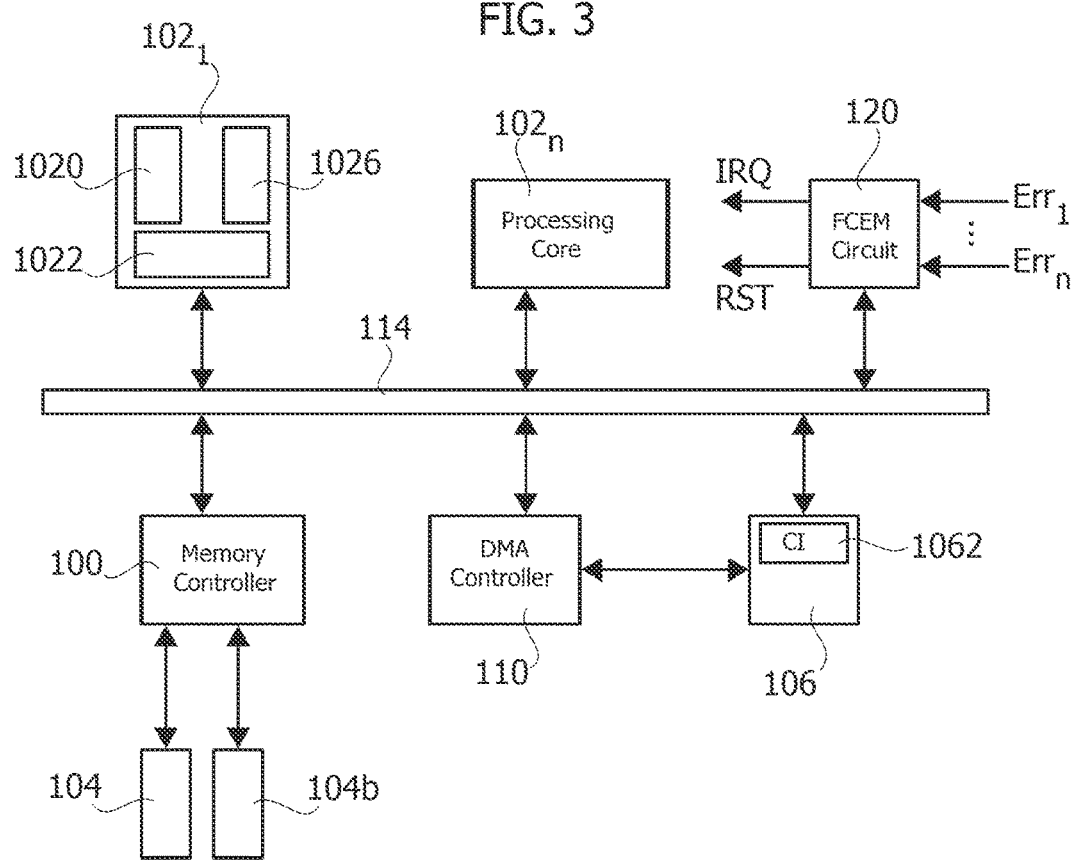

FIG. 3 shows an example of a multi-core processing system 10. Specifically, in the example considered, the processing system 10 comprises a plurality of n processing cores $102_1 \ldots 102_n$ connected to a (on-chip) communication system 114. For example, in the context of real-time control systems, the processing cores $102_1 \ldots 102_n$ may be ARM Cortex®—R52 cores. Generally, the communication system 114 may comprise one or more bus systems, e.g., based on the Advanced eXtensible Interface (AXI) bus architecture, and/or a Network-on-Chip (NoC).

For example, as shown at the example of the processing core $102_1$, each processing core 102 may comprise a microprocessor 1020 and a communication interface 1022 configured to manage the communication between the microprocessor 1020 and the communication system 114. Typically, the interface 1022 is a master interface configured to forward a given (read or write) request from the microprocessor 1020 to the communication system 114, and forward an optional response from the communication system 114 to the microprocessor 1020. However, the communication interface 1022 may also comprise a slave interface. For example, in this way, a first microprocessor 1020 may send a request to a second microprocessor 1020 (via the communication interface 1022 of the first microprocessor, the communication system 114 and the communication interface 1022 of the second microprocessor).

Generally, each processing core $102_1 \ldots 102_n$ may also comprise further local resources, such as one or more local memories 1026, usually identified as Tightly Coupled Memory (TCM).

As mentioned before, typically the processing cores $102_1 \ldots 102_n$ are arranged to exchange data with a non-volatile memory 104 and/or a volatile memory 104b. In a multi-core processing system 10, often these memories are system memories, i.e., shared for the processing cores $102_1 \ldots 102_n$. As mentioned before, each processing core $102_1 \ldots 102_n$ may, however, comprise one or more additional local memories 1026.

For example, as shown in FIG. 3, the processing system 10 may comprise one or more memory controllers 100 configured to connect at least one non-volatile memory 104 and at least one volatile memory 104b to the communication system 114. As mentioned before, one or more of the memories 104 and/or 104b may be integrated in the integrated circuit of the processing system 10 or connected externally to the integrated circuit.

As mentioned before, the processing system 10 may comprise one or more resources 106, such as one or more communication interfaces or co-processors (e.g., a cryptographic co-processor). The resources 106 are usually connected to the communication system 114 via a respective communication interface 1062. In general, the communication interface (CI) 1062 comprises at least a slave interface. For example, in this way, a processing core 102 may send a request to a resource 106 and the resource returns given data. Generally, one or more of the communication interfaces 1062 may also comprise a respective master interface. For example, such a master interface may be useful in case the resource has to start a communication in order to exchange data via (read and/or write) request with another circuit connected to the communication system 114, such as a resource 106 or a processing core 102. For example, for this purpose, the communication system 114 may indeed comprise an Advanced Microcontroller Bus Architecture (AMBA) High-performance Bus (AHB), and an Advanced Peripheral Bus (APB) used to connect the resources/peripherals 106 to the AMBA AHB bus.

Often such processing systems 10 comprise also one or more Direct Memory Access (DMA) controllers 110. For example, as shown in FIG. 3, a DMA controller 110 may be used to directly exchange data with a memory, e.g., the memory 104b, based on requests received from a resource 106. For example, in this way, a communication interface IF may directly read data (via the DMA controller 110) from the memory 104b and transmit these data, without having to exchange further data with a processing unit 102. Generally, a DMA controller 110 may communicate with the memory or memories via the communication system 114 or via one or more dedicated communication channels.

In this respect, irrespective of the complexity of the processing system 10 (e.g., with respect to the number of processing cores 102 and/or number and type of the resources 106), a typical processing system 10 comprises also fault collection and error management (FCEM) circuit 120.

For example, European patent application No. EP 3 534 261 A1 discloses possible embodiments of a fault collection and error management circuit 120, which is incorporated herein by reference for this purpose.

Figure 4:
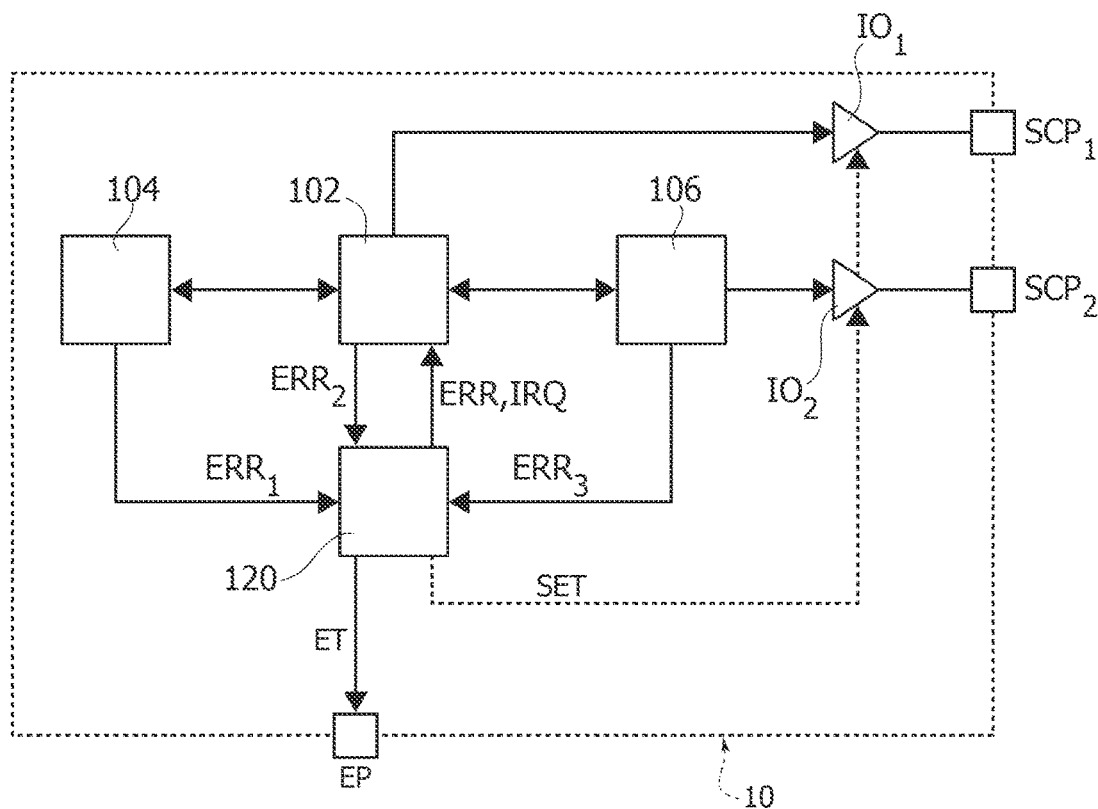
FIG. 4 shows an example of a processing system comprising a fault collection and error management circuit.

Specifically, as shown in FIG. 4, at least one of the circuits 102, 104 and 106 may generate one or more error signals $ERR_1, \ldots, ERR_m$. For example, such error signals ERR may be generated by at least one of:

a memory 104 supporting an error detection and optional correction function, which generates an error signal $ERR_1$ when the data read from the memory 104 contain errors and/or when data could not be written to the memory;

a processing core 102 configured to generate an error signal $ERR_2$ in response to a hardware and/or software failure; and a communication interface configured to generate an error signal $ERR_3$, corresponding to a hard error signal indicative of a hardware failure and/or a soft error signal indicative of a data transmission error.

In the example considered, the various error signals $ERR_1, \ldots, ERR_m$ are provided to the fault collection and error management circuit 120. In response to the error signals $ERR_1, \ldots, ERR_m$, the fault collection and error management circuit 120 may execute various operations.

For example, the fault collection and error management circuit 120 may be configured to generate at least one of:
- an interrupt signal IRQ provided to a processing core 102;
- a reset request signal RST provided to a reset management circuit of the processing system 10;
- a signal ET provided to a terminal EP of the processing system 10, e.g., in order to signal the error to an external circuit; and
- a signal SET used to set the output level of one or more safety critical terminals SCP of the processing system 10.

Specifically, due to an error, the circuits of the processing system 10 may not operate correctly, possibly generating incorrect signals at the pins/pads of the processing system 10. Some of the pins/pads of the processing system 10a may thus be safety-critical pins/pad, i.e., pins/pads which may generate critical situations when driven incorrectly. For example, in FIG. 4 is shown schematically a first safety-critical pin $SCP_1$, which is driven by a processing core 102, and a second safety-critical pin $SCP_2$, which is driven by a resource/peripheral 106, such as a communication interface or a PWM half-bridge driver.

Generally, each input/output pin/pad of the processing system 10 has usually associated a respective driver circuit IO, which is configured to drive the respective pin/pad as a function of the signal received from the respective block, e.g., the processing system 102 and the hardware resources 106. Generally, between the driver circuits IO and the blocks of the processing system 10a may also be arranged a dedicated logic, such as one or more multiplexers, permitting a configuration of the pin-mapping.

Accordingly, in line with the disclosure of document EP 3 534 261 A1, the driver circuit IO of a safety-critical pins/pads SCP may be configured to set the output level of the respective pin to a given safety state in response to a signal SET. The output level, such as a high-impedance state or a given logic level (high or low), may depend on the specific application needs. Preferably such a "safety state" is compliant to the ISO2626 specification.

Figure 5:
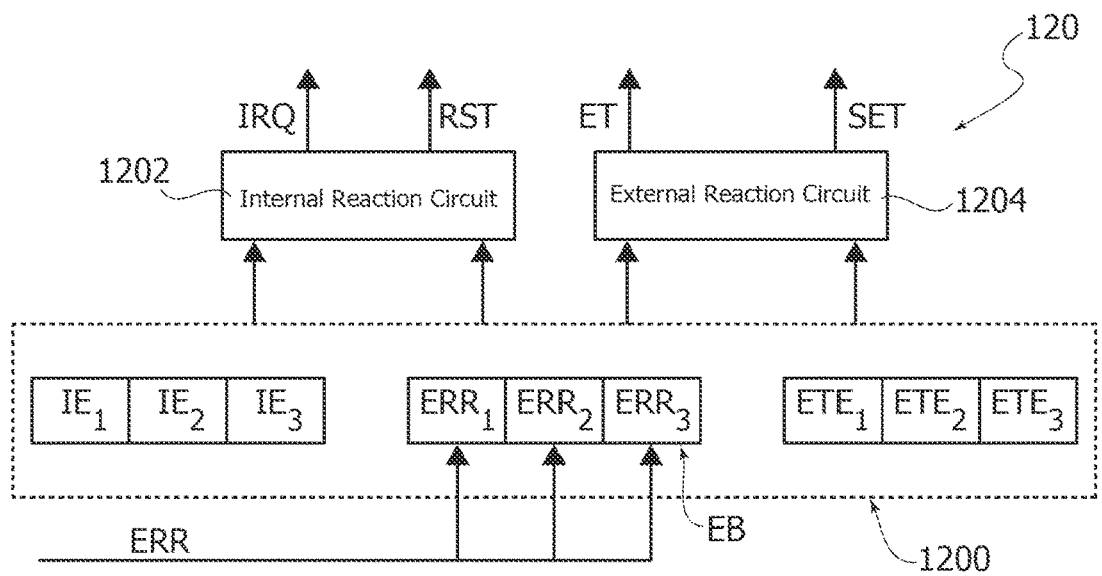
FIG. 5 shows an example of the fault collection and error management circuit of FIG. 4.

FIG. 5 shows a possible implementation of the fault collection and error management circuit 120.

In the example considered, the fault collection and error management circuit 120 comprises a register 1200. Specifically, in the example considered, the register 1200 comprises one or more error bits EB for storing the value of the error signals ERR. For example, considering the exemplary case of three error signals $ERR_1 \ldots ERR_3$, the register 1200 may comprise a corresponding number of error bits EB.

In the example considered, the fault collection and error management circuit 120 comprises an internal reaction circuit 1202. Specifically, the internal reaction circuit 1202 may be configured to generate the interrupt signal IRQ and/or the reset request signal RST as a function of the content of the error bits EB of the register 1200. The error bits EB are purely optional and the external reaction circuit 1202 may generate the interrupt signal IRQ and/or the reset request signal RST also directly as a function of the error signal(s) ERR.

Similarly, the fault collection and error management circuit 120 comprises an external reaction circuit 1204. Specifically, the external reaction circuit 1204 may be configured to generate the error trigger signal ET and/or the signal SET as a function of the content of the error bits EB of the register 1200. Again, the error bits EB are purely optional and the external reaction circuit 1204 may generate the signal ET and/or the signal SET also directly as a function of the error signal(s) ERR.

In general, the behavior of the reaction circuits 1202 and/or 1204 may also be programmable, e.g., by setting one or more configuration bits in the register 1200. For example, in the example considered, the register 1200 comprises:
- a respective interrupt enable bit IE for each of the error signals $ERR_1 \ldots ERR_3$, i.e., the interrupt signal IRQ is asserted when also the respective interrupt enable bit IE of an asserted error signal ERR is asserted;
- a respective error trigger enable bit ETE for each of the error signals $ERR_1 \ldots ERR_3$, i.e., the error trigger signal ET is asserted when also the respective error trigger enable bit ETE of an asserted error signal ERR is asserted.

Similarly, the register 1200 may comprise respective reset enable bits for the reset request signal REQ and/or respective enable bits for the safety signal SET.

In order to simplify the data exchange between the processing unit 102 and the registers 1200, the register 1200 may be directly addressable by the processing unit 102, which is schematically shown in FIG. 3, where the fault collection and error management circuit 120 is connected to the communication system 114.

Figure 6:
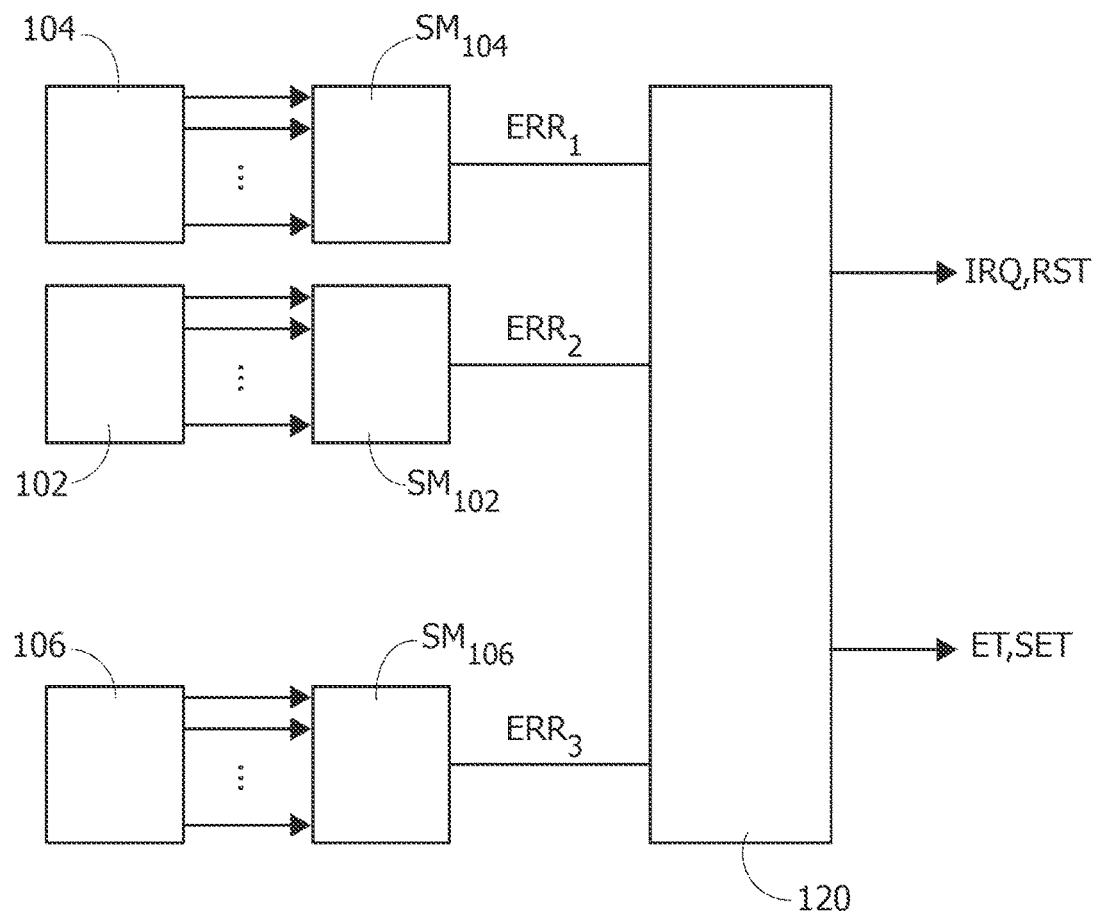
FIG. 6 shows an example of the connection between a plurality of safety monitoring circuits and the fault collection and error management circuit.

Typically, as shown in FIG. 6, the hardware error signals ERR are generated by dedicated safety monitor circuits SM. For example, such safety monitor circuits may comprise combinational and/or sequential logic circuits, which monitor the operation of a given circuit. Generally, such safety monitor circuits SM may also comprise analog components, e.g., in order to detect an out-of-range condition for an analog signal, such as an internal supply voltage or a signal indicative of the operating temperature of the processing system or a specific circuit of the processing system.

For example, FIG. 6 shows a safety monitor circuit $SM_{104}$ configured to monitor one or more signals of the memory 104, a safety monitor circuit $SM_{102}$ configured to monitor one or more signals of a processing core 102 and a safety monitor circuit $SM_{106}$ configured to monitor one or more signals of a resource/peripheral 106. Generally, the safety monitor circuit may also be integrated in the respective circuit.

Accordingly, typically each safety monitor circuit SM monitors one or more signals generated by and/or provided to the associated circuit, and determines whether the behavior of the signal(s) is normal or indicates an error. In general, the operations performed by a given safety monitor circuit SM depend on the associated circuit and may include, e.g.:
- a combinational analysis, e.g., by combining the signals of the associated circuit in order to determine whether the signal levels are congruent;
- a sequential analysis, e.g., by comparing the time evolution of one or more signals with one or more reference signals;
- an analysis of one or more analog signals, e.g., by comparing the value of an analog signal with one or more reference values; or
- a combination of the above analyses in order to implement a more complex abnormal behavior analysis.

For example, the safety monitor circuit $SM_{104}$ may comprise an error detection circuit of the memory 104, which calculates (via combinational and in some embodiments sequential logic operations) an error correction code for the data read from the memory and compares (via combinational logic operations) the calculated error correction code with an error correction code read from the memory.

Accordingly, in response to determining an abnormal behavior, the safety monitor circuit SM may assert a respective error signal ERR, which signals the error to the fault collection system 120.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

In the following FIGS. 7 to 15 parts, elements or components which have already been described with reference to FIGS. 1 to 6 are denoted by the same references previously used in such Figure; the description of such previously described elements will not be repeated in the following in order not to overburden the present detailed description.

As mentioned before, various embodiments of the present disclosure relate to a processing system configured to test the connection between one or more safety monitor circuits and a fault collection and error management circuit. For example, in various embodiments, the processing system is configured to test the connection of one or more safety monitor circuits comprising an ECC error detection circuit, i.e., a circuit configured to verify an error correction code (ECC). For a general description of these circuits, and a respective processing system 10, reference may be made to the previous description of FIGS. 1 to 6.

FIG. 7 and FIG. 8 show a generic processing system 10a comprising a master device 40 and a slave device 42, wherein the master device 40 and the slave device 42 use a conventional ECC protection scheme.

For example, in FIG. 7 the master circuit 40 transmits data DATA to the slave device 42. For example, the slave device 42 receives the data bits DATA and additional error correction code bits ECC generated by an error correction code generation circuit 44 configured to generate the bits ECC as a function of the data bits DATA.

For example, in various embodiments, the master device 40 may be a processing core 102, for example, a microprocessor 1020, or a DMA controller 110. Conversely, the slave device 42 may be a memory such as a non-volatile memory 104 or a volatile memory 104b, e.g., a RAM memory. For example, the error correction code generation circuit 44 may be integrated in the memory controller 100 of the memory 42. For example, the microprocessor 1020 or DMA controller 110 (master device 40) may send a write request comprising data MDATA (corresponding to the data DATA in FIG. 7) via the communication system 114 to the memory controller 100. The memory controller 100 may then calculate via the respective error correction code generation circuit 44 the bits ECC and write the data bits MDATA and the bits ECC to the memory, e.g., to a memory address MADR included in the write request.

Conversely, in FIG. 8 the master circuit 40 receives given data DATA from the slave device 42. For example, the slave device 42 provides the data bits DATA and the additional error correction code bits ECC.

For example, for this purpose, the microprocessor 1020 or the DMA controller 110 (master device 40) may send a read request via the communication system 114 to the memory controller 100. The memory controller 100 may then read the data bits MDATA and the bits ECC from the memory, e.g., from a memory address MADR included in the read request, and transmit the data bits MDATA (corresponding to the data in FIG. 8) to the microprocessor 1020 or DMA controller 110.

However, as shown in FIG. 8, in this case, an error detection circuit 46 is configured to verify the bits DATA and ECC, and possibly generate one or more error signals ERR. For example, the one or more error signals ERR may be provided to the master circuit 40 and/or a fault collection and error management circuit 120.

For example, the error detection circuit 46 may be integrated in the memory controller 100. For example, in case of a simple error detection circuit 46, this circuit just verifies the correctness of the bits DATA and ECC. However, the error detection circuit 46 may also provide information concerning the position of the error, which thus may be used by an error correction circuit to correct errors in the data bits DATA. Generally, the error correction circuit may be integrated with the error detection circuit in an error detection and correction circuit 46, or the error correction circuit may be a separate circuit. Accordingly, the circuit 46 may indeed provide corrected data bits DATA to the master device 40.

Moreover, such ECC schemes may also be used for the communications exchanged via the communication system 114, i.e., the various communication interfaces connected to the communication system 114 may be configured to add one or more Error Correction Codes (ECC) to the transactions exchanged via the communication system.

For example, FIG. 9 shows an embodiment, wherein the master interface 40, such as the communication interface of a processing core 102 or DMA controller 110, sends a write request via the communication system 114 to a slave interface 42, such as a communication interface of a memory controller 100 or a resource/peripheral 106. For example, in FIG. 9, the master interface 40 sends a write request comprising:

a physical target address ADR of the communication system 114 associated with the target slave interface 42,
data bits WDATA comprising the data to be transferred/written to the slave interface 42, and
one or more request control bits/signals REQC.

For example, the request control data REQC may indicate whether the request is a write request or a read request. The set of request control signals REQC depends on the used protocol and may include also other information, e.g., in order to indicate whether a single transaction is executed or whether a burst of multiple read or write transactions should be executed. For example, a memory controller may write the data WDATA to a memory address determined as a function of the physical target address ADR, and a resource may write the data WDATA to a register associated with the physical target address ADR.

In various embodiments, in response to the write request, the slave interface 42 may also return one or more response control bits RESC. The set of response control signals RESC depends on the used protocol and can include signals like a transaction response or acknowledge signal, used to indicate whether any error has been detected along the transaction and/or a ready signal indicating whether the slave circuit 42 is ready to accept a new transaction.

Conversely, FIG. 10 shows an embodiment, wherein the master interface 40 sends a read request via the communication system 114 to the slave interface 42. For example, in FIG. 10, the master interface 40 sends a read request comprising:

- a physical target address ADR of the communication system 114 associated with the target slave interface 42, and
- one or more request control bits REQC.

For example, as mentioned before, the request control data REQC may indicate that the request is a read request.

Accordingly, in response to the read request, the slave interface 42 return data bits RDATA comprising the (read) data to be transferred to the master interface 40. In some embodiments, the slave interface 42 may also return one or more response control bits RESC. For example, a memory controller may return the data read from a memory address determined as a function of the physical target address ADR, and a resource may return the content of a register associated with the physical target address ADR.

Accordingly, in various embodiments, each communication interface 40 or 42 may be configured to:
- generate ECC bits as a function of the bits to be transmitted to the communication system 114 and transmit these ECC bits with the other bits to the communication system 114; and
- verify the ECC bits received from the communication system 114.

Generally, the ECC bits may be added to all bits or only a subset of the bits, e.g., only to the address ADR and data bits WDATA/RDATA. For example, in order to guarantee a transaction protection in line with the ISO26262 ASIL levels, all signals (data WDATA/RDATA, address ADR, request control signals REQC, and response control signals RESC) may be protected by ECC bits. Accordingly, in various embodiments, a master interface 40 may be configured to add ECC bits to the address bits ADR, the request control bits REQC, and in case of a write request the respective data bits WDATA. Generally, the master interface 40 may generate the ECC bits for each of these bit groups (ADR, REQC, WDATA) or a combination thereof. Similarly, a slave interface 42 may be configured to add ECC bits to the response control bits RESC, and in case of a read request the respective data bits RDATA. Generally, the slave interface 42 may generate the ECC bits for each of these bit groups (RESC, RDATA) or a combination thereof. For example, in a currently preferred embodiments, the ECC bits are added to each type of signals separately, i.e., first ECC bits for the data WDATA or RDATA, second ECC bits for the address ADR, third ECC bits for the request control signals REQC, and fourth ECC bits for the response control signals RESC.

For example, this is schematically shown in FIGS. 9 and 10, wherein the master interface 40 comprises one or more error correction code generation circuits 44a and one or more error detection and optional correction circuits 46a. Similarly, the slave interface 42 comprises one or more error correction code generation circuits 44b and one or more error detection and optional correction circuits 46b. For example, in case separate ECC bits are added to the various types of signals and in order to permit a parallel processing, the master interface 40 may comprise three error correction code generation circuits 44a (for the address ADR, the request control bits REQC and the optional data WDATA) and two error detection and optional correction circuits 46a (for the response control bits RESC and the optional data RDATA). Conversely, the slave interface 42 may comprise two error correction code generation circuits 44b (for the response control bits RESC and the optional data RDATA) and three error detection and optional correction circuits 46a (for the address ADR, the request control bits REQC and the optional data WDATA).

Accordingly, each interface circuit connected to the communication system 114 and configured to exchange safety relevant information should be able to generate and verify the respective ECC bits. In this respect, each of these interface circuits may also comprise plural error correction code generation circuits 44 and plural error detection and optional correction circuits 46.

Usually, an error correction code generation circuit 44 does not generate an error signal, because the validity of the ECC bits associated with the information being transmitted is done by the entity receiving them. In fact, an error detection and correction circuits 46 may generate one or more error signals ERR, e.g., indicating whether an error has been detected and, in some embodiments, whether the error may be correct. Accordingly, in various embodiments, the processing system 10a is configured to test the connection between the various error detection and optional correction circuits 46 of the processing system 10a and the fault collection and error management circuit 120.

Figure 11:
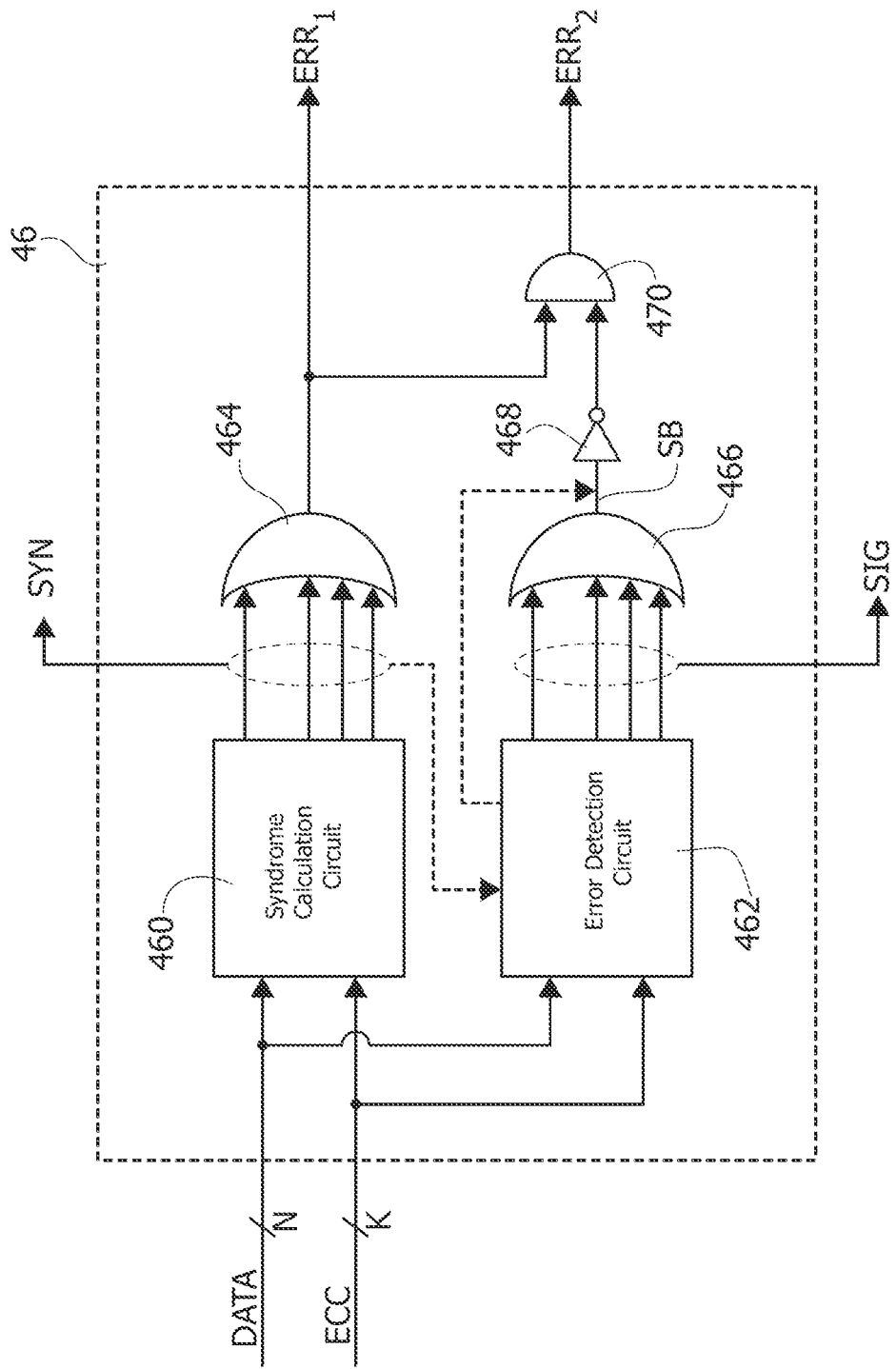
FIG. 11 shows an embodiment of an error detection circuit adapted to be used in the processing systems of FIGS. 8, 9 and/or 10.

FIG. 11 shows in this respect an embodiment of error detection circuit 46.

For example, in the embodiments considered, the error detection circuit 46 receives a number N of data bits DATA and a number K of ECC bits. Generally, while indicated generically with the reference sign DATA, indeed the data bits DATA may comprise bits also relating to the previous mentioned address ADR or MADR, data WDATA, RDATA or MDATA, request control bits REQC or response control bits RESC.

Generally, the number K of ECC bits depends on the number N of bits DATA and the ECC scheme, e.g., how many bits can be repaired, such as 64 data bits and 8 ECC bits. Thus, depending on the complexity of the implemented error correction code (ECC), the circuit 46 is able to detect up to a given number of flipped bits and eventually repair them. For example, in the field of micro-controllers adapted to be used in the automotive market, the adopted ECC scheme is usually able to detect up to two erroneous bits and repair one erroneous bit, so called Single-Error Correct (SEC) Double-Error Detect (DED) Code. For a general description of error detection and in some embodiments correction codes, reference can be made to the corresponding webpage "Error detection and correction" of Wikipedia, e.g., the version of May 6, 2021, the content thereof being incorporated herein by reference. For example, a possible implementation of a SECDED code is described in Application Note XAPP383 "Single Error Correction and Double Error Detection (SECDED) with CoolRunner-II™ CPLDs", v1.1, Aug. 1, 2003. Another possible error detection and correction circuit using a SECDED code is disclosed in document U.S. Pat. No. 8,381,083 B2. This document also discloses that the bits ECC may be calculated also for other data, e.g., for the address ADR.

For example, in the embodiment considered, the error detection circuit 46 comprises a syndrome calculation circuit 460 configured to:
- receive the data bits DATA and ECC bits;
- calculate the ECC bits for the received data bits DATA; and compare the calculated ECC bits with the received ECC bits.

In case of an error correction code, the result of this comparison, called syndrome SYN, is indicative of the position of the incorrect bit(s). The syndrome SYN corresponds to a bit sequence having K bits.

Accordingly, in case the syndrome SYN is different from a bit sequence of K bits set to zero, i.e., different from the value 0, an error is detected. For example, this is schematically shown in FIG. 11, where a logic gate 464, such as a logic OR gate, is used to generate an error signal $ERR_1$ as a function of the syndrome SYN, i.e., the error signal $ERR_1$ is asserted when at least one of the bits of the syndrome SYN is asserted. However, in case of a SEC code, the syndrome calculation circuit 460 is unable to detect double-bit errors. In fact, the error signal $ERR_1$ will be asserted both for a single bit error and a double-bit error.

Accordingly, in various embodiments, the error correction code verification circuit 46 also comprises a circuit 462 configured to, for example, detect single bit errors. For example, in the simplest case, the single bit error detection circuit 46 may verify an even or odd parity, thereby generating a signal SB indicating that a single bit error occurred. For example, in this case, the bits ECC may comprise one or more dedicated parity bits which may also not be provided to the syndrome calculation circuit 460.

However, often such single bit error detection circuit 462 are unable to distinguish between correct data and double bit-errors. Thus, by combining the error signal $ERR_1$ (indicating a single-bit error or double-bit error) and the signal SB (indicating a single bit error), it is possible to generate via a combinational logic circuit a signal $ERR_2$ indicating that a double-bit error occurred, e.g., by asserting the error signal $ERR_2$ when the error signal $ERR_1$ is asserted and the signal SB is de-asserted. For example, in the embodiment considered, the combinational logic circuit comprises an inverter 468 and a logic AND gate 470.

Accordingly, the error detection circuit 46 may be configured to use the syndrome SYN and the bit SB to generate a single-bit error signature SIG having N+K bits. For example, in the embodiment considered, this operation is implemented in the single bit error detection circuit 462.

For example, in case of a single-bit error, i.e., the signal SB is asserted, the circuit 46/462 is configured to assert the bit of the signal SIG corresponding to the position indicated by the syndrome SYN, while the other bits of the signal SIG are de-asserted.

In case the circuit 462 does not provide directly the signal SB, a corresponding signal SB may thus be generated via a logic combination of the bits of the signal SIG, e.g., via a logic OR gate 466, because at most only one of the bits of the signal SIG should be asserted.

Generally, also other ECC schemes/codes may be used in order to generate the bit-flip signature SIG, which could also indicate that more than one bit should be flipped, e.g., in case of a Double-Error Correct code. Similarly, in this case, the error signals $ERR_1$ and $ERR_2$ could indicate in general that an error occurred (error signals $ERR_1$) and, in some embodiments, that the error is correctable or not (error signals $ERR_2$).

Accordingly, in various embodiments, the signals $ERR_1$, $ERR_2$ and SIG may be provided to an error correction circuit, e.g., implemented in the circuit 46, which thus may:

in case no error is signaled (e.g., the signal $ERR_1$ is de-asserted and the signal $ERR_2$ is de-asserted) provide the original data DATA to the associated master interface 40 or slave interface 42;

in case of a correctable bit error (e.g., the signal $ERR_1$ is asserted and the signal $ERR_2$ is de-asserted) flip the logic level of the respective bit(s), for example, in case of a errors in the bits DATA, as indicated by the signature SIG, and provide the corrected data DATA to the associated master interface 40 or slave interface 42; and in case of an uncorrectable bit error (e.g., the signal $ERR_1$ is asserted and the signal $ERR_2$ is asserted), signal an error to the associated master interface 40 or slave interface 42.

Accordingly, the various ECC error detection circuits 46 of the processing system essentially represent safety monitoring circuits configured to monitor bits DATA (possibly comprising an address ADD/MADR, or control bits REQC or RESC) and verify whether the data bits DATA contain incorrect bits and, in some embodiments, uncorrectable bits. Consequently, in various embodiments, the error signals (e.g., $ERR_1$ and $ERR_2$) generated by an error detection circuit 46, and in some embodiments, the syndrome SYN and/or the signature SIG are provided to the fault collection and error management circuit 120 of the processing system1 10a.

The inventors have observed that a possible solution for testing the connectivity between an ECC error detection circuit 46 and the fault collection and error management circuit 120 consists in providing a bit sequency comprising one or more flipped bits to the input of the ECC error detection circuit 46. Generally, the bit sequency represents thus to a bit pattern, which, e.g., may correspond to:

a correct pattern, i.e., sequence of data bits DATA and ECC bits calculate as a function of the data bits DATA according to the used ECC scheme/code, a first error pattern comprising a correctable error, i.e., having a number of bit errors/flipped bits (with respect to a correct pattern) being between one and the maximum number of correctable bits errors, e.g., having a single bit error in case of a SEC code; or a second error pattern comprising an uncorrectable error, i.e., having a number of bit errors/flipped bits (with respect to a correct pattern) correspond to the maximum number of detectable bits errors, e.g., having a double bit error in case of a DED code.

For example, in case of a volatile memory 104b, the microprocessor 1020 may be configured to write an error pattern to a specific address, and then perform a read requests to the address, whereby the associated ECC error detection circuit 46 verifies the bit sequency and asserts the respective error signals. However, due to the fact that the ECC bits (for the read and write requests) are generated directly by the associated ECC generation circuit 44, additional circuits are needed to route the error pattern from the microprocessor 1020 to the memory 104b, thereby bypassing the ECC generation circuit 44. However, also such additional circuits would have to be protected against malfunctions.

Moreover, such a test may be used in case of an ECC error detection circuit 46 for a memory 104b, but cannot be extended easily to the test of the ECC error detection circuits 46 monitoring the transactions of the communication system 114, for example, with respect to the address and control signals. Finally, generating and writing corrupted data and/or ECC information to the memory, leaves the memory in a "dirty" state, because it contains memory locations with incorrect ECC information. For example, some processing systems may be configured to execute a periodic memory check routing, wherein all (or randomly selected) memory locations are tested by reading and verifying the respective content. In this case, the corrupted memory locations should thus be reset or correct data should be stored to the memory location.

In any case, such a software-based testing, would require that the microprocessor 1020 tests separately each ECC error detection circuit 46. However, in modern micro-controllers, a high number of ECC error detection circuits 46 would need to be tested, thus implying a long execution time. For example, this can be a problem when the maximum permitted start-up time of the processing system 10a is short, which is usually the case for automotive applications. However, such a test could only be executed during the start-up phase of the processing system 10a, because during runtime the memory 104b may already have stored data.

In the following will thus be described different solutions for testing the connectivity between the ECC error detection circuits 46 and the system fault collection and detection circuit 120.

For example, in various embodiments, the disclosed solutions are particularly useful when an ECC protection of the transitions exchanged via the communication system 114 is used, because the solutions may be used to generate the error in any kind of bit sequence, and for example, the previous mentioned data WDATA/RDATA, address ADR and control signals REQC/RESC. However, the disclosed solutions may also be used in the context of an ECC memory protection, e.g., by using the solution only for the data bits MDATA stored to the memory or by storing also additional ECC bits to the memory 104/104b, wherein the additional ECC bits have been calculated as a function of the respective memory address MADR.

Figure 12:
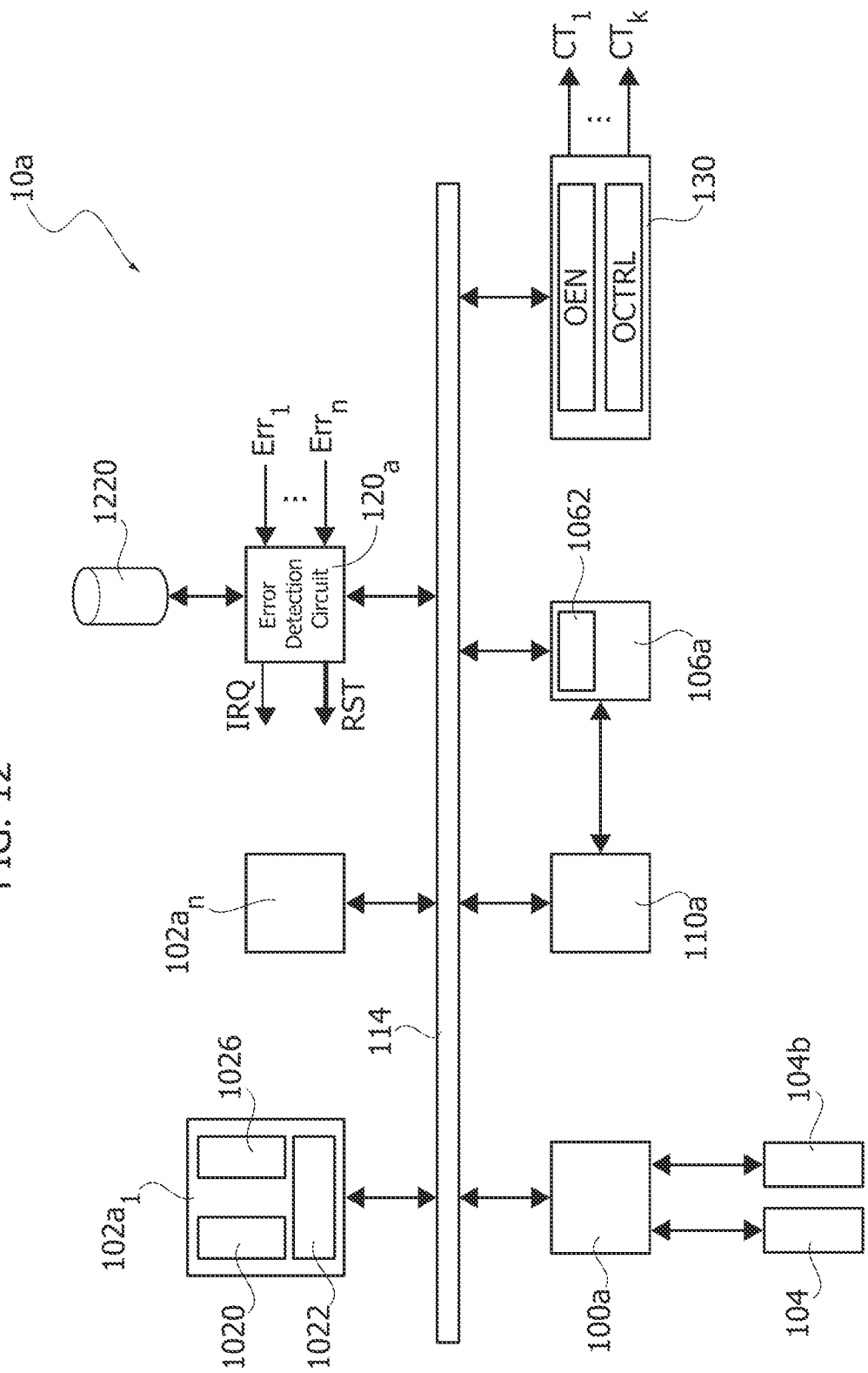
FIG. 12 shows an embodiment of a processing system comprising a connectivity test control circuit.

FIG. 12 shows a processing system 10a according to the present disclosure.

For example, also in this case, the processing system 10a comprises at least one processing core 102a comprising at least one microprocessor 1020, i.e., at least one microprocessor 1020 is connected via a communication interface 1022 to a communication system 114, e.g., comprising a system bus or a NoC. For example, the communication interface 1022 is at least a master communication interface configured to send read or write requests to the communication system 114, i.e., the processing core 102a is a master circuit 40. In some embodiments, the processing system 10a may also comprise one or more further master circuits 40, such as a DMA controller 110a, connected to the communication system 114. The processing system 10a comprises also at least one slave device 42, such as a memory controller 100a or a resource/peripheral 106a.

As mentioned before, when using an ECC protection for the transactions exchanged via the communication system 114, at least the safety relevant circuits or all circuits connected to the communication system 114 comprise an ECC generation circuit 44 configured to calculate ECC bits for the bits transmitted to the communication system 114 and verify the ECC bits received from the communication system 114 (see also the description of FIGS. 9 and 10). For example, each master circuit 40 comprises an error detection, and in some implementations, correction circuit 46 configured to verify the ECC bits for the response control bits RESC and/or the data RDATA (in case of a read request). Conversely, each slave circuit 42 comprises an error detection (and optional correction) circuit 46 configured to verify the ECC bits for the address ADR, the request control bits REQC and/or the data WDATA (in case of a write request).

Conversely, when using an ECC protection for a memory 104 or 104b, the respective memory controller 100a may comprise an ECC generation circuit 44 configured to calculate ECC bits for respective data MDATA stored to the memory, wherein the memory controller 100 stores the ECC bits to the memory. In various embodiments, the ECC generation circuit 44 calculates also further ECC bits for the address MADR used to select the respective memory location, wherein the memory controller 100 stores the further ECC bits to the memory. Accordingly, in this case, when the memory controller 100a reads data MDATA from a given address MADR of the memory, the memory controller 100a may also read the respective ECC bits and the optional further ECC bits, and an error detection (and optional correction) circuit 46 may be configured to verify the ECC bits for the read data MDATA and/or, in some embodiments, the address MADR. Generally, a similar ECC memory protection may also be implemented within a processing core 102a for the (local) memory 102b.

Accordingly, each error detection circuit 46 may be configured to receive data bits DATA and ECC bits, For example, as mentioned before, the data bits DATA may correspond to the data WDATA/RDATA/MDATA, address ADR/MADR or control bits REQ/RESC. Next, the error detection circuit 46 calculates further ECC bits as a function of the received data bits DATA according to the used ECC scheme/code, generates a syndrome SYN by comparing the calculated ECC bits with the received ECC bits and verifies whether all bits of said syndrome SYN are de-asserted. For example, when at least one of the bits of the syndrome SYN is asserted, the error detection circuit 46 may assert an error signal $ERR_1$.

For example, in various embodiments, in case of data bits RDATA, WDATA or MDATA, the circuit 46 is an error detection and correction circuit configured to correct up to a given number of correctable bits. For example, for this purpose may be used a block code, such as Reed-Solomon, Golay, BCH (Bose-Chaudhuri-Hocquenghem), Multidimensional parity, or Hamming code, such as a SECDED Hamming code. Conversely, in case of address or control bits, the circuit 46 may just be an error detection circuit configured to detect up to a given number of detectable incorrect bits. For example, in this case may be used one or more parity bits, such as one or two parity bits, whereby the syndrome SYN does not provide information concerning the position of the error, but just whether an error occurred or not.

As shown in FIG. 12, the various error signals ERR are provided to a fault collection and error management circuit 120a. For example, the fault collection and error management circuit 120a may generate one or more internal and/or external reactions as a function of the error signals ERR. In various embodiments, the fault collection and error management circuit 120a may also implement a logging function, as schematically shown via a list, e.g., implemented with a memory 1220, associated with the fault collection and error management circuit 120a. For example, in order to permit a suitable logging function, when detecting an error, an error detection circuit 46 may not only provide the error signal(s) ERR to the fault collection and error management circuit 120a, but also further information, for example, the respective syndrome SYN and/or the used address, i.e., the address ADR in case of an ECC transaction protection or the address MADR in case of an ECC memory protection.

In fact, the address and syndrome may be important for both the error management and device quality. For example, if the syndrome SYN reports an ECC error, then the fault may result either due to an unrepairable hardware failure (bit is stuck) or a soft error (dynamic bit flip). Accordingly, in the latter case, it would be possible to repair the error, e.g., by overwriting the memory at the address MADR where the error occurred. Also, the syndrome SYN may be used by the error management circuit 120a to analyze whether a similar error already occurred for the same address, e.g., the memory address MADR. For example, in case, the same error has already been reported (i.e., the list 1220 comprises already the same combination of address ADR/MADR and syndrome SYN), then the error management circuit 120a may not add an additional record, but increase a count value associated with the record. For example, in this way the error management circuit 120a may verify whether the count value reaches a given maximum value indicative of a maximum number of acceptable ECC bit failures along the device life-time.

For example, in various embodiments, only the error detection and in some embodiments, correction circuits 46 configured to monitor data bits WDATA, RDATA or MDATA are configured to also transmit the address (ADR in case of WDATA or RDATA; MADR in case of MDATA) and the syndrome SYN. Conversely, the error detection circuit monitoring address (ADR, MADR) or control bits (REQC, RESC) may just report whether an error occurred, possibly also transmitting the respective address. For example, as mentioned before, only the syndrome SYN calculated for the data bits may also indicate the error position, while a simple error detection code may be used for the address and control signals.

As shown in FIG. 12, in order to execute the connectivity test of a given ECC error detection circuit 46, the processing system 10a comprises an ECC connectivity test circuit 130 configured to generate for each of the ECC error detection circuit 46 one or more respective connectivity test control signals CT, such as connectivity test control signals $CT_1 \ldots CT_k$.

In various embodiments, the ECC connectivity test circuit 130, also identified herein as Operational Safety Check And Reporting (OSCAR) circuit, is connected via a respective slave interface (not shown in FIG. 12) to the communication system 114 and may comprise a set of register used to generate the connectivity test control signals CT. In the embodiments considered, these registers of the ECC connectivity test circuit 130 are programmable by sending respective write requests via the communication system 114, whereby the operation of the ECC connectivity test circuit 130 may be controlled via software instructions executed by a microprocessor 1020.

Additionally, or alternatively, the ECC connectivity test circuit 130 may be configured to execute automatically a given ECC connectivity test sequence when the processing system 10a is switched on and/or in response to a given command received via the communication system 114.

Accordingly, in various embodiments, the ECC connectivity test circuit/OSCAR IP 130 may be a system IP used for all ECC error detection circuits 46, or at least a plurality of the ECC error detection circuits 46. Moreover, in various embodiments, the ECC connectivity test circuit 130 comprises registers used to decide which ECC error detection circuits 46 shall be tested and, in some embodiments, which type of error shall be generated.

Accordingly, in various embodiments, each ECC error detection circuit 46 to be tested has associated a dedicated test circuit, configured to modify the input signals of the ECC error detection circuit 46 as a function of the respective connectivity test control signal(s) CT.

For example, as will be described in greater detail in the following, in various embodiments, the proposed solution may be used to:
  enable a given type of connectivity test for one or more (or even all) ECC error detection circuits 46, wherein the connectivity test is executed once a respective write or read requests is executed; and/or
  to directly inject a given ECC error in a given ECC error detection circuit 46.

Thus, the complexity of the SW used to test an ECC error detection circuits 46 is reduced, and thus also the time needed to run the ECC connectivity test. Moreover, in various embodiments, the ECC connectivity test may also be executed during the run-time of the final application. For example, as will be described in greater detail in the following, the ECC connectivity test may be used to test the connectivity "on-the-fly", without the need to write corrupted data to a storage location, such as a memory location or a register.

For example, in order to generate the connectivity test control signals CT, the ECC connectivity test circuit 130 may comprise
  an optional enable register OEN; and
  a plurality of control register OCTRL.

For example, the enable register OEN may be used to enable the generation of the control signals CT as a function of the content of the connectivity test control register OCTRL. Generally, the number of control registers OCTRL depends on the number of ECC error detection circuits 46 connected to the ECC connectivity test circuit 130 and, in some embodiments, the type of ECC error to be injected, such as a single bit error or double-bit error. For example, the control register OCTRL may comprises for each ECC error detection circuits 46 a plurality of bits controlling which type of error should be generated in the respective ECC error detection circuits 46, such as a correctable error (e.g., a single bit error) or an uncorrectable error (e.g., a double bit error).

Figure 13:
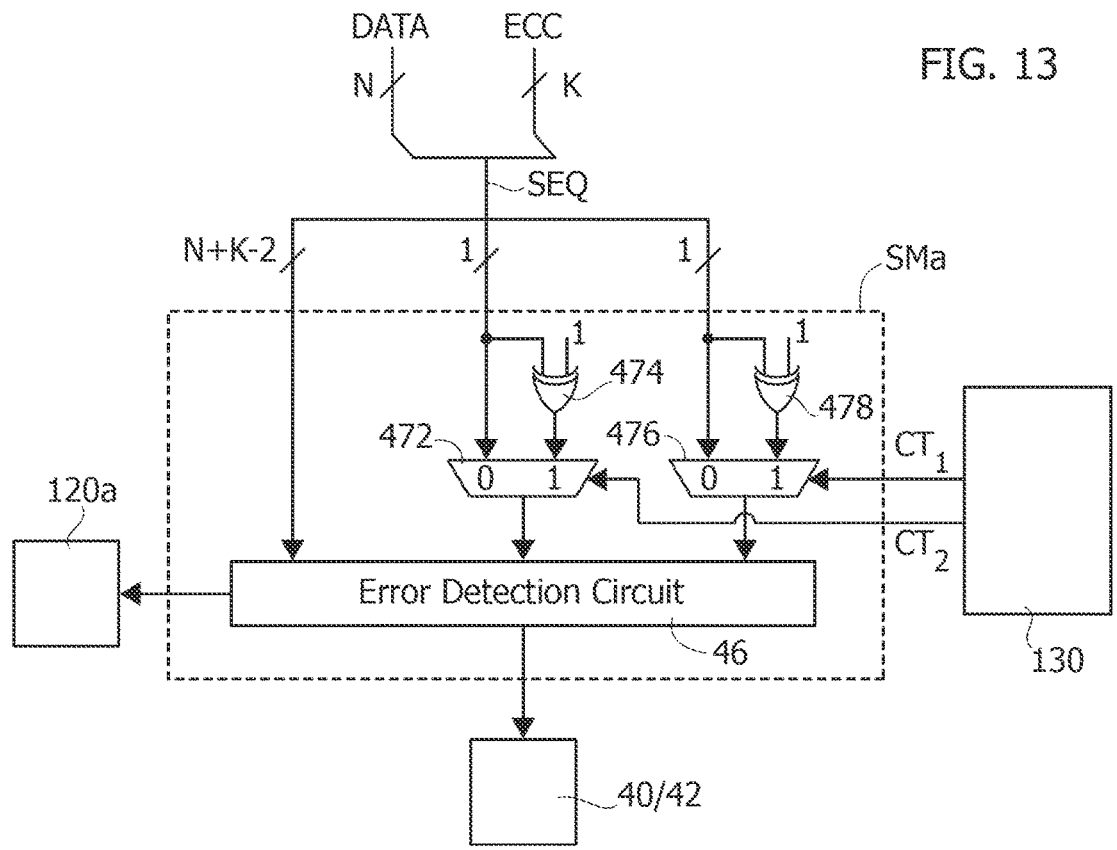
FIG. 13 shows a first embodiment of a safety monitor circuit comprising an ECC error detection circuit and a connectivity test circuit.
Figure 14:
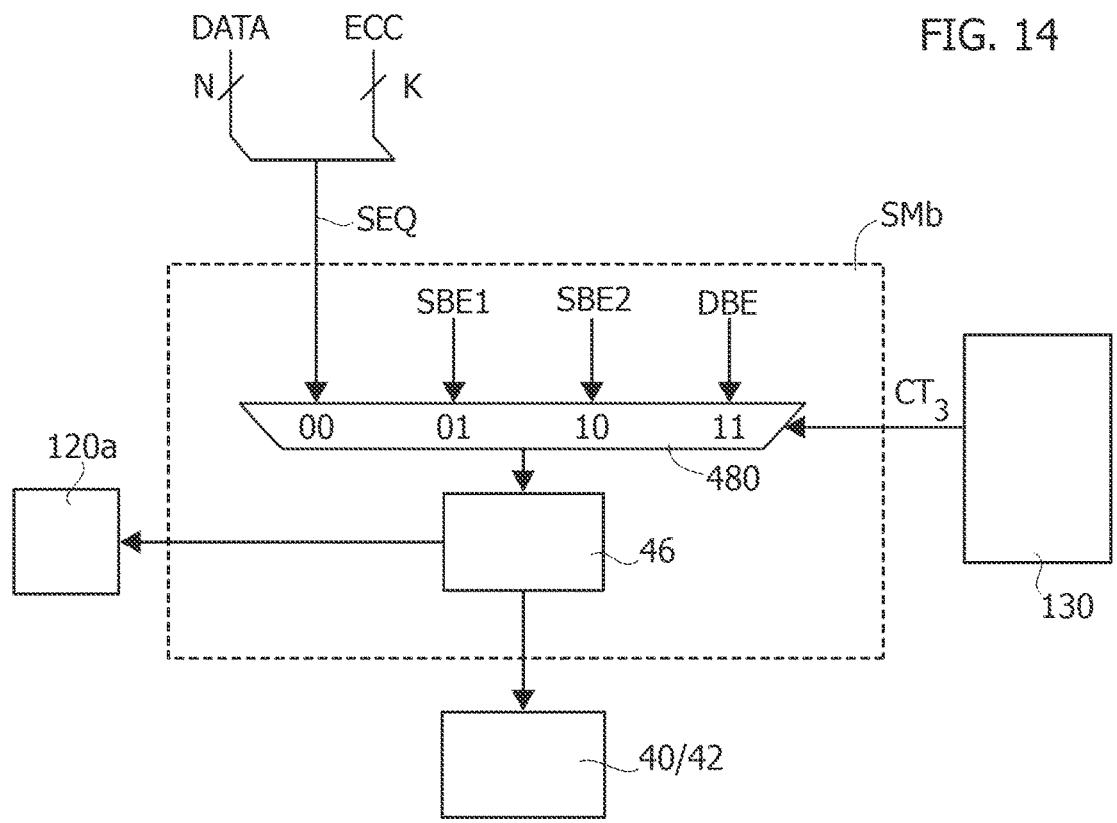
FIG. 14 shows a second embodiment of a safety monitor circuit comprising an ECC error detection circuit and a connectivity test circuit.

FIGS. 13 and 14 show two embodiments of the test circuit associated with a given ECC error detection circuit 46. For example, FIGS. 13 and 14 show embodiments of safety monitor circuits SMa and SMb, respectively, comprising an ECC error detection circuit 46.

For example, in line with the previous description, the ECC error detection circuit 46 is configured to receive a bit sequency SEQ having N bits of data DATA and K ECC bits. Based on the verification of the ECC bits, the ECC error detection circuit 46 is configured to generate:
  signals provided to the fault collection and error management circuit 120a, for example, the one or more error signals ERR and, in some embodiments, the syndrome SYN and/or the address ADR/MADR; and
  signals provided to the associated master circuit 40 or slave circuit 42, such as:
  in case the circuit 46 implements only an error detection function, the one or more error signals ERR and the optional bit-flip signature SIG, which may be used by an error correction circuit of the circuit 40/42 to correct the data DATA; or
  in case the circuit 46 implements also an error correction function, the corrected data.

For example, the signals provided to the fault collection and error management circuit 120a may depend on the type of data bits DATA, which are verified by the ECC error detection circuit 46. For example, in case of an ECC error detection circuit 46 configured to verify the ECC bits of an address ADR/MADR or control signals REQC/RESC, the ECC error detection circuit 46 may only provide one or more error signals ERR indicating whether the respective bits sequence SEQ comprises incorrect bits, in some embodiments, also providing the respective address ADR/MADR. Conversely, in case of an ECC error detection circuit 46 configured to verify the ECC bits of data WDATA, RDATA or MDATA, the ECC error detection circuit 46 may provide the one or more error signals ERR, the syndrome SYN and the respective address ADR (in case of transactions) or MADR (in case of memory accesses).

For example, the logging of the syndrome may be done for the data MDATA to check the quality of the memory bits, which may be an indication of the quality of the device process and manufacturing. Conversely, address bit flipping occurs usually due to transient faults, happening because of unexpected causes, and are not considered necessarily as an indication of bad quality, thus not requiring the logging of the respective syndrome. The same applies for the control signal faults.

For example, in the embodiment shown in FIG. 13, the safety monitor circuit SMa is configured to selectively flip a given number of bits of the bit sequence SEQ. For example, as mentioned before, an ECC code is usually configured to detect a given maximum number of incorrect bits, and in some embodiments, correct a given maximum number of incorrect bits, wherein usually the maximum number of detectable incorrect bits corresponds to the maximum number of correctable incorrect bits plus one, as it is the case, e.g., for a SECDED code where the maximum number of detectable incorrect bits corresponds to two and the maximum number correctable incorrect bits corresponds to one.

Accordingly, in various embodiments, the safety monitor circuit SMa is configured to flip up to the maximum number of detectable incorrect bits, e.g., up to two bits in case of a SECDED code. For example, in various embodiments, the safety monitor circuit SMa is configured to:
  not flip any bit of the bit sequence SEQ, e.g., when respective connectivity test control signals CT1 and CT2 are de-asserted;
  flip a given first number of bits, wherein the first number of bits correspond to the maximum number of detectable incorrect bits, e.g., when the connectivity test control signals CT1 and CT2 are asserted; and
  flip a given second number of bits, wherein the second number of bits is selected between one and the maximum number of correctable incorrect bits, e.g., when the connectivity test control signal CT1 is asserted and the connectivity test control signal CT2 is de-asserted (or vice versa).

Accordingly, the safety monitor circuit SMa is configured to provide to the ECC error detection circuit 46, as a function of the respective connectivity test control signals CT, the original bit sequency SEQ, a bit sequency SEQ with an uncorrectable error or a bit sequency SEQ with a correctable error.

For example, FIG. 13 shows a possible embodiment in case of a SECDED code, wherein the safety monitor circuit SMa is configured to selectively flip a first bit of the sequence SEQ as a function of the connectivity test control signal CT1, e.g., via a multiplexer 472 and a XOR gate 474, and a second bit of the sequence SEQ as a function of the connectivity test control signal CT2, e.g., via a multiplexer 476 and a XOR gate 478. Generally, instead of using a multiplexer 472/476 and an XOR gate 474/478, the respective bit may be generated also directly via an XOR gate receiving at a first input the respective bit of the sequence SEQ and at a second input the respective connectivity test control signal CT1/CT2.

Conversely, in the embodiment shown in FIG. 14, the safety monitor circuit SMb is configured to provide, e.g., via a multiplexer 480, to the ECC error detection circuit 46, as a function of the respective connectivity test control signal CT, such as a connectivity test control signal CT3:
  the original bit-sequency SEQ,
  a bit-sequency DBE with an uncorrectable error, e.g., having a double bit error;
  one or more bit-sequences SBE with a correctable error, such as two sequences SBE1 and SB2 having a single bit error.

In various embodiments, the bit sequences DBE and SBE are fixed/hardwired.

Accordingly, in both embodiments, usually two bits (test control signals CT1 and CT2, or a test control signal CT3 having two bits) are sufficient in order to apply given error patterns to the ECC error detection circuit 46, i.e., only two bit-lines have to be connected between the ECC connectivity test circuit 130 and the various ECC safety monitor circuits SMa/SMb. Those of skill in the art will appreciate that the embodiment shown in FIG. 13 has a significantly reduced complexity with respect to the embodiment shown in FIG. 14. However, as will be described in greater detail in the following, the solution of FIG. 14 permits to substitute the original input data SEQ with a completely different value.

Generally, the embodiments shown in FIGS. 13 and 14 may be applied to any kind of data bits, such as the data WDATA/RDATA/MDATA, address ADD/MADR, and control bits REQC/RESC, because it does not rely on writing permanent corrupted data. In fact, for address and control signals, this would be usually not be possible, because these signals are generated on-the-fly by the master and slave circuit 40/42.

In this respect, the proposed ECC connectivity test may be used to selectively trigger different type of ECC errors without the need to store corrupted data to a memory location. This also permits to verify whether the safety monitor circuit SMa/SMb reports the error (possibly including the respective address and/or syndrome) to the fault collection and error management circuit 120a, and whether the fault collection and error management circuit 120a correctly manages the resorted error.

As mentioned before, while the safety monitor circuit SMa is configured to selectively alter up to the given maximum number of bits (corresponding to the maximum number of detectable incorrect bits), the safety monitor circuit SMb permits to replace the complete bit sequence. For example, the safety monitor circuit SMb may be used for the ECC error detection circuits 46 configured to also report the syndrome SYN. For example, as mentioned before, this may apply to the ECC error detection circuits 46 configured to verify the data RDATA, WDATA or MDATA, which may also report the address ADR/MADR and/or the syndrome SYN. Accordingly, in this case, not only the transmission of the error signals ERR should be verified, but also the transmission of the address ADR/MADR and/or the syndrome SYN.

Figure 15:
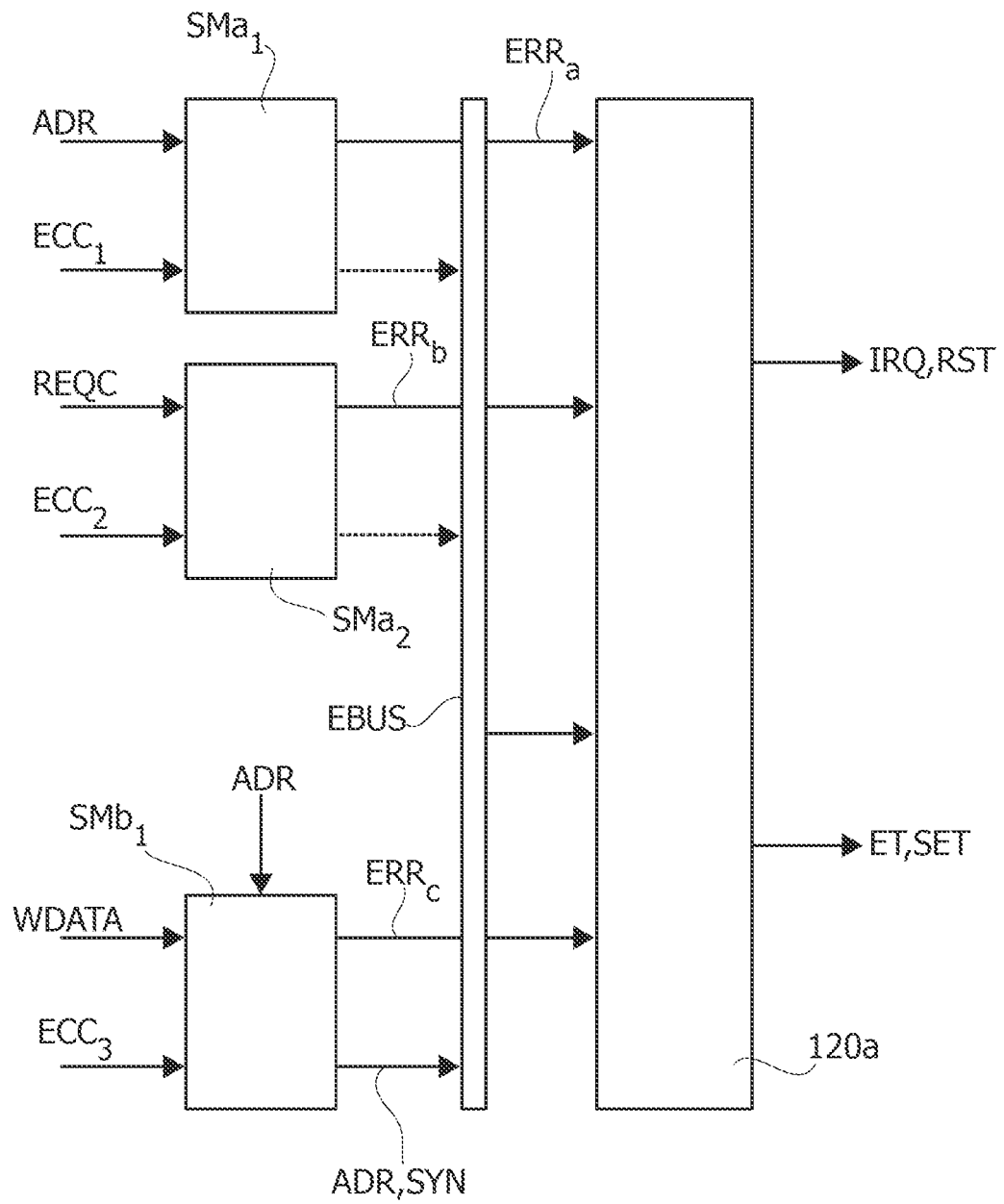
FIG. 15 shows an embodiment of the connection between a plurality of safety monitoring circuits and the fault collection and error management circuit.

For example, FIG. 15 shows an embodiment of the connection of a plurality of safety monitor circuits to the fault collection and error management circuit 120a. For example, in the embodiment considered, the processing system 10a comprises for a given slave interface connected to the communication system 114:

a first safety monitor circuit $SMa_1$ configured to receive address bits ADR and respective bits $ECC_1$;

a second safety monitor circuit $SMa_2$ configured to receive request control bits REQC and respective bits $ECC_2$; and a third safety monitor circuit $SMa_2$ configured to receive request control bits REQC and respective bits $ECC_3$.

For example, in the embodiment considered, the safety monitor circuits $SMa_1$ and $SMa_2$ correspond to the safety monitor circuit SMa described with respect to FIG. 13, e.g., comprising just an error detection circuit 46. In this case, the safety monitor circuits $SMa_1$ and $SMa_2$ may be configured to transmit, in case of an error, one or more respective error signals $ERR_a$ or $ERR_b$ to the fault collection and error management circuit 120*a*, and in some embodiments, also the address bits ADR. Conversely, the safety monitor circuit $SMb_1$ corresponds to the safety monitor circuit SMb described with respect to FIG. 14, e.g., comprising an error detection and correction circuit 46. In this case, the safety monitor circuit $SMb_1$ may be configured to transmit, in case of an error, one or more respective error signals $ERR_c$ to the fault collection and error management circuit 120*a*, and also the address bits ADR and/or the syndrome SYN generated by the error detection circuit 46 of the safety monitor circuit $SMb_1$.

For example, in various embodiments, the various error signals ERR are provided separately to the fault collection and error management circuit 120*a*. Conversely, the address and/or syndrome SYN are transmitted via a shared error bus EBUS.

In general, in order to test the connectivity of the reported address ADR/MADR and/or syndrome SYN, each bit of the reported signal should be set to high and to low, thereby permitting a detection of a line being stuck to low or high. Accordingly, in order to test the connectivity of a given signal, the bits of the signal should be set to two complementary bit sequences.

For example, in case of the connection shown in FIG. 15, each error signal ERR should be set to high and low. Moreover, assuming that only the safety monitor circuits SMb provide the address signal ADR and/or the syndrome SYN, e.g., to the error bus EBUS, the address signal ADR and/or the syndrome SYN provided to the fault collection and error management circuit 120*a* should be set to two complementary bit sequences.

As described in the foregoing, the ECC syndrome SYN corresponds to a signature, which may be used to repair the failed data. The value of the syndrome SYN depends on which bit(s) are flipped and uniquely identify them. Thus, knowing the used ECC scheme/code, two bit-sequences may be selected for the safety monitor circuit SMb, e.g., at design time, which generate complementary syndromes SYN. For example, this is shown in FIG. 14, wherein two bit-sequences SBE1 and SB2 with a correctable error are used. For example, the bit sequence SBE1 comprises a correctable error and generates a first syndrome SYN1, and the bit sequence SBE2 comprises a correctable error and generates a second syndrome SYN2, wherein the bit values of the second syndrome SYN2 correspond to the inverted version of the bit values of the first syndrome SYN1.

For example, in order to test the correct reporting, the software executed by a microprocessor 1020 may activate a first value, e.g., SBE1, execute a read operation, and verify whether the expected syndrome SYN has been logged to the list 1220. The software may then activate the second value, e.g., SBE2, execute a read operation, and verify whether the expected syndrome SYN has been logged to the list 1220.

Generally, also plural bit sequences SBE could be used in order to set each bit of the syndrome at least one to high and at least once to low.

Conversely, usually the test of the reporting of the address signal ADR/MADR, e.g., via the error bus EBUS, does not require a safety monitor circuit SMb, because the microprocessor 1020 may perform, when having activated the connectivity test function, two (or more) read requests to addresses ensuring that each bit of the address ADD/MADR is set once to high and once to low, e.g., by using two addresses having complementary bit sequences. In this respect, such an address reporting test is simplified because a read request to almost any address/memory location may be executed, without having to write previously corrupted data to the target address.

Accordingly, the solutions disclosed herein may be used in the context of an ECC verification of the communication system 114 or an ECC memory.

In case of an ECC memory, the safety monitor circuit associated with the memory controller 100*a* is configured to verify the ECC bits for the data MDATA. In this case, the safety monitor circuit SMb (overwrite of data MDATA) may be used. The ECC error detection circuit 46 of the safety monitor circuit SMb may also report the syndrome SYN and/or the address MADR. Thus, the address reporting of the memory address MADR may be verified by setting the address MADR to two complementary values, while activating an error pattern SBE or DBE for the respective data MDATA. Conversely, the syndrome reporting may be tested via the two sequences SBE1 and SBE2. In some embodiments, the memory controller 100*a* may also have associated a safety monitor circuit configured to verify ECC bits for the memory address MADR. However, in this case, the safety monitor circuit SMa may be sufficient for the verification of the memory address MADR.

In case of an ECC transaction verification, the master device 40 may use a safety monitor circuit SMa for the response control signals RESC and a safety monitor circuit SMb for the data RDATA. The ECC error detection circuit 46 of the safety monitor circuit SMb may also report the syndrome SYN and/or the address ADR. Thus, the address reporting may be verified by setting the address ADR (included in the respective read request sent to the communication system 114) to two complementary values, while activating an error pattern SBE or DBE for the respective data RDATA. Conversely, the syndrome reporting may be tested via the two sequences SBE1 and SBE2 within the safety monitor circuit SMb used for the data RDATA.

Similarly, the slave device 42 may use a safety monitor circuit SMa for the address ADR, a safety monitor circuit SMa for the request control signals REQC, but a safety monitor circuit SMb for the data WDATA.

Generally, in case the various safety monitor circuits configured to report a syndrome and/or address are connected to a bus EBUS, also a single safety monitor circuit SMb would be sufficient in order to test the error bus. However, due to the fact that the various ECC safety monitor circuits may be located at different positions within the integrated circuit of the processing system 10*a*, i.e., the error bus EBUS may be long, the safety monitor circuit for the data MDATA, WDATA and RDATA are preferably safety monitor circuits SMb as shown in FIG. 14, which thus permit to test the correct forwarding of the syndrome from the safety monitor circuit SMb to the fault collection and error management circuit 120*a*.

In summary, the ECC connectivity test circuit 130 is a general-purpose controller that interfaces a specific logic test circuit used to alter the input of a respective ECC error detection circuit 36. It can be easily scaled according to the device complexity and number of ECC safety monitor circuits SMa and SMb, permitting an easy integration and testing for the devices belonging to a family of products.

Of course, without prejudice to the principle of the disclosure, the details of construction and the embodiments may vary widely with respect to what has been described and illustrated herein purely by way of example, without thereby departing from the scope of the present disclosure, as defined by the ensuing claims.

A processing system (10a) may be summarized as including a communication system (114); a processing core (102a) including a microprocessor (1020) and a master communication interface (1022) configured to transmit read or write requests from said microprocessor (1020) to said communication system (114), wherein a read request includes a physical target address (ADR) and requests the transmission of first data (RDATA) from said physical target address (ADR) to said master communication interface (1022), and wherein a write request includes a physical target address (ADR) and second data (WDATA) to be transmitted to said physical target address (ADR); a memory controller (100a) configured to, based on a memory address (MADR), read third data (MDATA) from a memory (104, 104b) or write said third data (MDATA) to said memory (104, 104b), wherein said memory controller (100a) is configured to receive a request addressed to a first sub-range of said physical target addresses (ADR) associated with said memory controller (100a), determine said memory address (MADR) as a function of the received request, determine whether the received request is a read or write request, in response to determining that the received request is a read request, read said third data (MDATA) from said memory address (MADR) and transmit said read third data (MDATA) as said first data (RDATA) to said communication system (114), and in response to determining that the received request is a write request, extract said second data (WDATA) from said write request and write said extracted second data (WDATA) as third data (MDATA) to said memory address (MADR); a resource (106a) including one or more registers and a slave interface (1062) configured to receive a request addressed to a second sub-range of said physical target addresses (ADR) associated with said one or more registers, select one of said one or more registers as a function of the physical target address (ADR) included in the received request, determine whether the received request is a read or write request, in response to determining that the received request is a read request, transmit the content of said selected register as said first data (RDATA) to said communication system (114), and in response to determining that the received request is a write request, extract said second data (WDATA) from said write request and write said extracted second data (WDATA) to said selected register; one or more safety monitor circuits (SMa, SMb) including an error detection circuit (46) configured to receive data bits (DATA) and respective Error Correction Code, ECC, bits (ECC), said data bits (DATA) corresponding to said first data (RDATA), said second data (WDATA) or said third data (MDATA), calculate further ECC bits as a function of said data bits (DATA) according to a given ECC scheme adapted to detect up to a given maximum number of detectable incorrect bits, generate a syndrome (SYN) by comparing said calculated ECC bits with said received ECC bits, determine whether all bits of said syndrome (SYN) are de-asserted, and in response to determining that at least one of the bits of said syndrome (SYN) is asserted, assert an error signal ($ERR_1$), a fault collection and error management circuit (120a) configured to receive said error signals ($ERR_1$) from said one or more safety monitor circuit (SMa, SMb); wherein each safety monitor circuit (SMa, SMb) includes a test circuit (472-478; 480) configured to provide modified data bits (DATA) and/or modified ECC bits (ECC) to the respective error detection circuit (46) as a function of one or more connectivity test control signals (CT), whereby said error detection circuit (46) asserts said error signal ($ERR_1$) as a function of said connectivity test control signals (CT); and wherein the processing system (10a) includes a connectivity test control circuit (130) including one or more control registers (OEN, OCTRL) programmable via said write requests, wherein said one or more connectivity test control signals (CT) are generated as a function of the content of said one or more control registers (OEN, OCTRL).

Said connectivity test control circuit (130) may be configured to generate for each safety monitor circuit (SMa, SMb) one or more respective connectivity test control signals (CT) as a function of respective one or more bits of said one or more control registers (OEN, OCTRL).

A first safety monitor circuit (SMa, SMb) may be associated with said master communication interface (1022) of said processing core (102a), wherein said master communication interface (1022) may be configured to receive, in response to a read request, in addition to said first data (RDATA) respective first ECC bits (ECC) and, once having received said first data (RDATA) and the respective first ECC bits (ECC), provide said first data (RDATA) and the respective first ECC bits (ECC) to said first safety monitor circuit (SMa, SMb), thereby selectively asserting said error signal ($ERR_1$) of said first safety monitor circuit (SMa, SMb) as a function of said one or more connectivity test control signals (CT) once said master communication interface (1022) receives said first data (RDATA).

A second safety monitor circuit (SMa, SMb; $SMb_1$) may be associated with said memory controller (100a) or said resource (106a), wherein said memory controller (100a) or said resource (106a) may be configured to receive with a write request, in addition to said second data (WDATA), respective second ECC bits ($ECC_c$) and, once having received a write request, provide the respective second data (WDATA) and the respective second ECC bits ($ECC_c$) to said second safety monitor circuit (SMa, SMb; $SMb_1$), thereby selectively asserting said error signal ($ERR_1$) of said second safety monitor circuit (SMa, SMb; $SMb_1$) as a function of said one or more connectivity test control signals (CT) once said memory controller (100a) or said resource (106a) receives said write request.

A third safety monitor circuit (SMa, SMb; $SMa_1$) may be associated with said memory controller (100a) or said resource (106a), wherein said memory controller (100a) or said resource (106a) may be configured to receive with a read or write request, in addition to said address (ADR), respective third ECC bits ($ECC_a$) and, once having received a read or write request, provide the respective address (ADR) and the respective third ECC bits ($ECC_a$) to said third safety monitor circuit (SMa, SMb; $SMa_1$), thereby selectively asserting said error signal ($ERR_1$) of said third safety monitor circuit (SMa, SMb; $SMa_1$) as a function of said one or more connectivity test control signals (CT) once said memory controller (100a) or said resource (106a) receives said read or write request.

A fourth safety monitor circuit (SMa, SMb) may be associated with said memory controller (100a), wherein said memory controller (100a) may be configured to read in addition to said third data (MDATA) respective fourth ECC bits (ECC) from said memory address (MADR) and, once having received said third data (MDATA) and the respective fourth ECC bits (ECC), provide said third data (MDATA) and the respective fourth ECC bits (ECC) to said fourth safety monitor circuit (SMa, SMb), thereby selectively asserting said error signal (ERR$_1$) of said fourth safety monitor circuit (SMa, SMb) as a function of said one or more connectivity test control signals (CT) once said memory controller (100a) reads data from said memory (104, 104b).

Said first safety monitor circuit (SMa, SMb) may be configured to, in response to determining that at least one of the bits of the respective syndrome (SYN) may be asserted, transmit the respective syndrome (SYN) and/or the address (ADR) included in the respective read request to said fault collection and error management circuit (120a); and/or said second safety monitor circuit (SMa, SMb; SMb$_1$) may be configured to, in response to determining that at least one of the bits of the respective syndrome (SYN) may be asserted, transmit the respective syndrome (SYN) and/or the address (ADR) included in the respective write request to said fault collection and error management circuit (120a); and/or said fourth safety monitor circuit (SMa, SMb) may be configured to, in response to determining that at least one of the bits of the respective syndrome (SYN) may be asserted, transmit the respective syndrome (SYN) and/or the memory address (MADR) used for the respective read operation to said fault collection and error management circuit (120a).

Said first and/or second safety monitor circuits (SMa, SMb) may be configured to transmit said syndrome (SYN) and/or said address (ADR) via an error bus (EBUS), and/or said fourth safety monitor circuit (SMa, SMb) may be configured to transmit said syndrome (SYN) and/or said memory address (MADR) via said error bus (EBUS).

Said first, second and/or fourth safety monitor circuits (SMa, SMb) may include a multiplexer (480) configured to provide to the respective error detection circuit (46), as a function of said connectivity test control signals (CT) said first data (RDATA), said second data (WDATA) or said third data (MDATA), respectively, and the respective first, second or third ECC bits (ECC); a first bit sequency (SBE1), said first bit sequency configured to generate a first syndrome (SYN) when processed by the respective error detection circuit (46); and a second bit sequency (SBE2), said second bit sequency configured to generate a second syndrome (SYN) when processed by the respective error detection circuit (46), wherein said second syndrome (SYN) corresponds to a bit sequency having inverted values with respect to the bit sequence of said first syndrome (SYN).

Said third safety monitor circuit (SMa, SMb; SMa$_1$) may include a combinational logic circuit (472-478) configured to selectively invert the logic level of one or more bits of said address (ADR) and/or the respective third ECC bits (ECC$_a$).

Said fault collection and error management circuit (120a) may include one or more further registers (1200) and may be configured to store the logic levels of said error signals (ERR$_1$) to said one or more further registers (1200); receive a read request addressed to a third sub-range of said physical target addresses (ADR) associated with said one or more further registers (1200), select one of said one or more further registers (1200) as a function of the physical target address (ADR) included in the received read request, and transmit the content of said selected further register (1200) as said first data (RDATA) to said communication system (114).

An integrated circuit may be summarized as including a processing system (10a).

A device, such as a vehicle, may be summarized as including a plurality of processing systems (10a), wherein said processing system (10a) are connected via a further communication system (20).

A method of operating a processing system (10a) may be summarized as including executing the following steps, via software instructions executed by said microprocessor (1020) programming said one or more control registers (OEN, OCTRL) in order to generate said one or more connectivity test control signals (CT), and transmitting one or more read requests to said memory controller (100a) and/or said resource (106a).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A processing system comprising:
a communication system;
a processing core comprising a microprocessor and a master communication interface configured to transmit read or write requests from said microprocessor to said communication system, wherein a read request comprises a physical target address and requests transmission of first data from said physical target address to said master communication interface, and wherein a write request comprises a physical target address and second data to be transmitted to said physical target address;
a memory controller configured to, based on a memory address, read third data from a memory or write said third data to said memory, wherein said memory controller is configured to:
receive a first request addressed to a first sub-range of physical target addresses associated with said memory controller;
determine a memory address based on the first request;
determine whether the first request is a read or write request;
in response to determining that the first request is a read request, read said third data from said memory address and transmit said third data as said first data to said communication system; and
in response to determining that the first request is a write request, extract said second data from said write request and write said extracted second data as third data to said memory address;
a resource comprising one or more registers and a slave interface configured to:

receive a second request addressed to a second subrange of said physical target addresses associated with said one or more registers;
select one of said one or more registers based on a physical target address included in the second request;
determine whether the second request is a read request or a write request;
in response to determining that the second request is a read request, transmit a content of said selected register as said first data to said communication system; and
in response to determining that the second request is a write request, extract said second data from said second request and write said extracted second data to said selected register;
one or more safety monitor circuits including an error detection circuit configured to:
receive data bits and respective error correction code (ECC) bits, said data bits corresponding to said first data, said second data or said third data;
calculate further ECC bits based on said data bits according to an ECC scheme adapted to detect up to a first number of detectable incorrect bits;
generate a syndrome by comparing said further ECC bits with said received ECC bits;
determine whether all bits of said syndrome are de-asserted; and
in response to determining that at least one of the bits of said syndrome is asserted, assert an error signal;
a fault collection and error management circuit configured to receive said error signal from said one or more safety monitor circuits; and
a connectivity test control circuit including one or more control registers programmable via said write request, wherein one or more connectivity test control signals are generated based on a content of said one or more control registers, and
wherein each safety monitor circuit includes a test circuit configured to provide one or more of modified data bits or modified ECC bits to the respective error detection circuit based on said one or more connectivity test control signals, said error detection circuit asserting said error signal based on said connectivity test control signals.

2. The processing system according to claim 1, wherein said connectivity test control circuit is configured to generate for each safety monitor circuit one or more respective connectivity test control signals based on respective one or more bits of said one or more control registers.

3. The processing system according to claim 1, wherein a first safety monitor circuit is associated with said master communication interface of said processing core, wherein said master communication interface is configured to receive, in response to a read request, in addition to said first data, respective first ECC bits and, responsive to having received said first data and the respective first ECC bits, provide said first data and the respective first ECC bits to said first safety monitor circuit, thereby selectively asserting said error signal of said first safety monitor circuit based on said one or more connectivity test control signals responsive to said master communication interface receiving said first data.

4. The processing system according to claim 1, wherein a second safety monitor circuit is associated with said memory controller or said resource, wherein said memory controller or said resource is configured to receive with a write request, in addition to said second data, respective second ECC bits and, responsive to having received a write request, provide the respective second data and the respective second ECC bits to said second safety monitor circuit, thereby selectively asserting said error signal of said second safety monitor circuit based on said one or more connectivity test control signals responsive to said memory controller or said resource receiving said write request.

5. The processing system according to claim 1, wherein a third safety monitor circuit is associated with said memory controller or said resource, wherein said memory controller or said resource is configured to receive with a read or write request, in addition to said physical target address, respective third ECC bits and, responsive to having received a read or write request, provide the physical target address and the respective third ECC bits to said third safety monitor circuit, thereby selectively asserting said error signal of said third safety monitor circuit based on said one or more connectivity test control signals responsive to said memory controller or said resource receiving said read or write request.

6. The processing system according to claim 1, wherein a fourth safety monitor circuit is associated with said memory controller, wherein said memory controller is configured to read, in addition to said third data, respective fourth ECC bits from said memory address and, responsive to having received said third data and the respective fourth ECC bits, provide said third data and the respective fourth ECC bits to said fourth safety monitor circuit, thereby selectively asserting said error signal of said fourth safety monitor circuit based on said one or more connectivity test control signals responsive to said memory controller reading data from said memory.

7. The processing system according to claim 3, wherein:
said first safety monitor circuit is configured to, in response to determining that at least one of the bits of the respective syndrome is asserted, transmit one or more of the respective syndrome or the physical target address included in the read request to said fault collection and error management circuit;
a second safety monitor circuit is configured to, in response to determining that at least one of the bits of the respective syndrome is asserted, transmit one or more of the respective syndrome or the physical target address included in the write request to said fault collection and error management circuit; and
a fourth safety monitor circuit is configured to, in response to determining that at least one of the bits of the respective syndrome is asserted, transmit one or more of the respective syndrome or the memory address used for a read operation to said fault collection and error management circuit.

8. The processing system according to claim 7, comprising an error bus, wherein:
said first and second safety monitor circuits are configured to transmit the one or more of the respective syndrome or the physical target address via the error bus; and
said fourth safety monitor circuit is configured to transmit the one or more of the respective syndrome or the memory address via the error bus.

9. The processing system according to claim 3, wherein said first, second and fourth safety monitor circuits each include a multiplexer configured to provide to the respective error detection circuit, based on said connectivity test control signals:
said first data, said second data or said third data, respectively, and the respective first, second or third ECC bits;

a first bit sequency, said first bit sequency configured to generate a first syndrome when processed by the respective error detection circuit; and a second bit sequency, said second bit sequency configured to generate a second syndrome when processed by the respective error detection circuit, wherein said second syndrome corresponds to a bit sequency having inverted values with respect to the bit sequence of said first syndrome.

10. The processing system according to claim 5, wherein said third safety monitor circuit comprises a combinational logic circuit configured to selectively invert a logic level of one or more bits of said physical target address or the respective third ECC bits.

11. The processing system according to claim 1, wherein said fault collection and error management circuit comprises one or more further registers and is configured to:
store logic levels of said error signal to said one or more further registers;
receive a read request addressed to a third sub-range of said physical target addresses associated with said one or more further registers;
select one of said one or more further registers based on the physical target address included in the received read request; and
transmit the content of said selected further register as said first data to said communication system.

12. An integrated circuit having a processing system, the processing system comprising:
a communication system;
a processing core comprising a microprocessor and a master communication interface configured to transmit read or write requests from said microprocessor to said communication system, wherein a read request includes a physical target address and requests transmission of first data from said physical target address to said master communication interface, and wherein a write request includes a physical target address and second data to be transmitted to said physical target address;
a safety monitor circuit including an error detection circuit, configured to:
receive data bits and respective error correction code (ECC) bits, said data bits corresponding to said first data or said second data;
calculate new ECC bits based on said data bits using an ECC scheme adapted to detect up to a first number of detectable incorrect bits;
generate a syndrome by comparing said new ECC bits with said received ECC bits;
determine that a bit of the syndrome is asserted; and
in response to the determining that a bit of the syndrome is asserted, assert an error signal.

13. The integrated circuit according to claim 12, wherein the processing system comprises:
a fault collection and error management circuit configured to receive the error signal from the safety monitor circuit; and
a connectivity test control circuit including a control register programmable via the write request,
wherein the safety monitor circuit includes a test circuit configured to provide one or more of a modified data bit or a modified ECC bit to the error detection circuit based on a connectivity test control signal, the error detection circuit asserting the error signal based on the connectivity test control signal.

14. The integrated circuit according to claim 13, wherein the connectivity test control circuit is configured to generate the connectivity test control signal based on a content of the control register.

15. A device, comprising:
a plurality of processing systems; and
a first communication system, the plurality of processing systems coupled to one another via the first communication system,
wherein a processing system of the plurality of processing systems includes:
a communication system;
a processing core comprising a microprocessor and a master communication interface configured to transmit read or write requests from said microprocessor to said communication system, wherein a read request comprises a physical target address and requests transmission of first data from said physical target address to said master communication interface, and wherein a write request comprises a physical target address and second data to be transmitted to said physical target address;
a safety monitor circuit including an error detection circuit configured to:
receive data bits and respective error correction code (ECC) bits, said data bits corresponding to said first data or said second data;
calculate new ECC bits based on said data bits using an ECC scheme adapted to detect up to a first number of detectable incorrect bits;
generate a syndrome by comparing said new ECC bits with said received ECC bits;
determine that a bit of the syndrome is asserted, and
in response to the determining that a bit of the syndrome is asserted, assert an error signal.

16. The device according to claim 15, wherein the processing systems comprise:
a fault collection and error management circuit configured to receive the error signal from the safety monitor circuit; and
a connectivity test control circuit including a control register programmable via the write request,
wherein the safety monitor circuit includes a test circuit configured to provide one or more of a modified data bit or a modified ECC bit to the error detection circuit based on a connectivity test control signal, the error detection circuit asserting the error signal based on the connectivity test control signal.

17. The device according to claim 16, wherein the connectivity test control circuit is configured to generate the connectivity test control signal based on a content of the control register.

18. The device according to claim 15, wherein the processing systems comprise:
a memory controller configured to, based on a memory address, read third data from a memory or write said third data to said memory, wherein said memory controller is configured to:
receive a first request addressed to a first sub-range of physical target addresses associated with said memory controller;
determine a memory address based on the first request;
determine whether the first request is a read or write request;
in response to determining that the first request is a read request, read said third data from said memory address and transmit said third data as said first data to said communication system; and in response to determining that the first request is a write request, extract said second data from said write request and write said extracted second data as third data to said memory address.

19. The device according to claim 18, wherein the safety monitor circuit is configured to:

receive data bits and error correction code (ECC) bits corresponding to the third data; and calculate new ECC bits based on the data bits corresponding to the third data.

20. The device according to claim 15, wherein the safety monitor circuit comprises a combinational logic circuit configured to selectively invert a logic level of one or more bits of the received data bits or the ECC bits.

* * * * *